US012785660B2

(12) United States Patent
Yuan et al.

(10) Patent No.: US 12,785,660 B2
(45) Date of Patent: Nov. 3, 2026

(54) ACOUSTIC RESONATOR CASCADE

(71) Applicant: RF360 Singapore Pte. Ltd., Singapore (SG)

(72) Inventors: Tingting Yuan, Munich (DE); Ibrahim Mehinovic, Munich (DE); Stefan Ammann, Grosskarolinenfeld (DE); Khai Yuan Chang, Munich (DE); Philipp Schwegler, Blaubeuren (DE); Robert Koch, Großkarolinenfeld (DE)

(73) Assignee: RF360 Singapore Pte. Ltd., Singapore (SG)

( * ) Notice: Subject to any disclaimer, the term of this patent is extended or adjusted under 35 U.S.C. 154(b) by 826 days.

(21) Appl. No.: 18/326,793

(22) Filed: May 31, 2023

(65) Prior Publication Data

US 2024/0405748 A1 Dec. 5, 2024

(51) Int. Cl.
*H03H 9/64* (2006.01)
*H03H 9/25* (2006.01)
*H03H 9/72* (2006.01)

(52) U.S. Cl.
CPC ............ *H03H 9/6436* (2013.01); *H03H 9/25* (2013.01); *H03H 9/725* (2013.01)

(58) Field of Classification Search
CPC ........ H03H 9/6436; H03H 9/25; H03H 9/725; H03H 9/02866; H03H 9/644
See application file for complete search history.

(56) References Cited

U.S. PATENT DOCUMENTS 3,550,045 A 12/1970 Adler
7,067,956 B2 6/2006 Imai et al.
2002/0153970 A1 * 10/2002 Noto ................. H03H 9/02559 333/195
2004/0077325 A1 4/2004 Takamine

OTHER PUBLICATIONS

International Search Report and Written Opinion—PCT/SG2024/050295—ISA/EPO—Sep. 3, 2024.

* cited by examiner

*Primary Examiner* — Emily P Pham
(74) *Attorney, Agent, or Firm* — Polsinelli

(57) ABSTRACT

An apparatus is disclosed for an acoustic resonator cascade. In example aspects, the apparatus includes at least one filter circuit. The at least one filter circuit includes a substrate, a first resonator cascade, and a second resonator cascade. The substrate has a surface including a first axis and a second axis. The first resonator cascade has multiple acoustic resonators and is disposed on the surface of the substrate in a first column along the first axis. The second resonator cascade has multiple acoustic resonators and is disposed on the surface of the substrate in a second column along the first axis. A first gap extends along the second axis between the first resonator cascade and the second resonator cascade. A second gap extends along the second axis between the first resonator cascade and the second resonator cascade. The first gap is different from the second gap.

20 Claims, 15 Drawing Sheets

700-1

700-2

ACOUSTIC RESONATOR CASCADE

TECHNICAL FIELD

This disclosure relates generally to signal communication or signal processing using an electronic device and, more specifically, to employing a filter circuit with a cascade of acoustic resonators.

BACKGROUND

Electronic devices include traditional computing devices such as desktop computers, notebook computers, smartphones, wearable devices like a smartwatch, internet servers, and so forth. Electronic devices also include other types of computing devices such as personal voice assistants (e.g., smart speakers), wireless access points or routers, thermostats and other automated controllers, robotics, automotive electronics, devices embedded in other machines like refrigerators and industrial tools, Internet of Things (IoT) devices, medical devices, and so forth. These various electronic devices provide services relating to productivity, communication, social interaction, security, health and safety, remote management, entertainment, transportation, and information dissemination. Thus, electronic devices play crucial roles in modern society.

Many of the services provided by electronic devices in today's interconnected world depend at least partly on electronic communications. Electronic communications can include, for example, those exchanged between two or more electronic devices using wireless or wired signals that are transmitted over one or more networks, such as the Internet, a Wi-Fi® network, or a cellular network. Electronic communications can therefore include wireless or wired transmissions and receptions. To transmit and receive communications, an electronic device can use a transceiver, such as a wireless transceiver that is designed for wireless communications.

Electronic communications can therefore be realized by propagating signals between two wireless transceivers at two different electronic devices. For example, using a wireless transmitter, a smartphone can transmit a wireless signal to a base station over the air as part of an uplink communication to support mobile services. Using a wireless receiver, the smartphone can receive a wireless signal that is transmitted from the base station via the air medium as part of a downlink communication to enable mobile services. With a smartphone, mobile services can include making voice and video calls, participating in social media interactions, sending messages, watching movies, sharing videos, and performing searches. Other mobile services can include using map information or navigational instructions, finding friends, engaging in location-based services generally, transferring money, obtaining another service like a car ride, and so forth.

Many of these mobile services depend at least partly on the transmission or reception of wireless signals between two or more electronic devices. Consequently, researchers, electrical engineers, and designers of electronic devices strive to develop wireless transceivers that can use wireless signals effectively to provide these and other mobile services.

SUMMARY

A wireless transceiver or a radio-frequency (RF) front-end can include a filter that passes the desired frequencies of a signal but suppresses the undesired ones. An example type of filter circuit includes one or more acoustic resonators that can filter frequencies of RF signals using sound waves. In a resonator cascade, multiple acoustic resonators are coupled together. In some circumstances, during operation of a first resonator cascade, bulk waves propagate through a substrate to reflect off the backside of the substrate and then couple to a second resonator cascade. The reflected bulk waves of the first resonator cascade and the second resonator cascade can "constructively" interfere and therefore cause significant spurious modes in the output signal. To at least reduce this interference, this document describes positioning individual ones of the acoustic resonators of at least one resonator cascade, such as those of the second resonator cascade, to be spatially shifted from those of the first resonator cascade by different amounts for each acoustic resonator of two or more acoustic resonators. This spatial shifting results in gaps that have different lengths between respective acoustic resonators of the first resonator cascade and respective acoustic resonators of the second resonator cascade. Accordingly, the reflected bulk waves caused by respective acoustic resonators of the first resonator cascade arrive at respective acoustic resonators of the second resonator cascade at different phases of the wave after traveling different distances across the various gaps having different lengths. By arriving at different phases, these reflected bulk waves interfere to a lesser degree, and the spurious modes are thereby reduced.

In an example aspect, an apparatus is disclosed. The apparatus includes at least one filter circuit. The at least one filter circuit includes a substrate, a first resonator cascade of multiple acoustic resonators, and a second resonator cascade of multiple acoustic resonators. The substrate includes a surface having a first axis and a second axis. The first resonator cascade of multiple acoustic resonators is disposed on the surface of the substrate in a first column along the first axis. The second resonator cascade of multiple acoustic resonators is disposed on the surface of the substrate in a second column along the first axis. A first gap extends along the second axis between the first resonator cascade of multiple acoustic resonators and the second resonator cascade of multiple acoustic resonators. A second gap extends along the second axis between the first resonator cascade of multiple acoustic resonators and the second resonator cascade of multiple acoustic resonators, with the first gap being different from the second gap.

In an example aspect, an apparatus is disclosed. The apparatus includes at least one filter circuit. The at least one filter circuit includes a substrate, a first resonator cascade of multiple acoustic resonators, and a second resonator cascade of multiple acoustic resonators. The substrate includes a surface having a first axis and a second axis. The substrate also includes a backside that is opposite the surface. The first resonator cascade of multiple acoustic resonators is disposed on the surface of the substrate in a first column along the first axis. The second resonator cascade of multiple acoustic resonators is disposed on the surface of the substrate in a second column along the first axis, with the second column spaced apart from the first column along the second axis. The at least one filter circuit also includes means for reducing at the second resonator cascade interference from bulk wave signaling that emanates from the first resonator cascade and reflects off the backside of the substrate.

In an example aspect, a method for manufacturing at least one filter circuit is disclosed. The method includes providing a substrate comprising a surface having a first axis and a second axis. The method also includes disposing a first resonator cascade comprising multiple acoustic resonators on the surface of the substrate in a first column along the first axis and disposing a second resonator cascade comprising multiple acoustic resonators on the surface of the substrate in a second column along the first axis. The method additionally includes forming a first gap that extends along the second axis between at least one acoustic resonator of the first resonator cascade and at least one acoustic resonator of the second resonator cascade. The method further includes forming a second gap that extends along the second axis between at least one other acoustic resonator of the first resonator cascade and at least one other acoustic resonator of the second resonator cascade, with the first gap being different from the second gap.

BRIEF DESCRIPTION OF DRAWINGS

FIG. 2-1 is a schematic diagram illustrating an example radio-frequency (RF) front-end and an example transceiver that can each include at least one filter circuit.

FIG. 2-2 is a schematic diagram illustrating an example RF front-end (RFFE) that can include one or more filter circuits coupled between at least one antenna and one or more amplifiers.

FIGS. 6-1 to 6-5 are schematic diagrams illustrating example implementations of two resonator cascades in which gaps between multiple acoustic resonators of the two resonator cascades have different lengths.

FIG. 7-1 is a graph illustrating an example reflection coefficient corresponding to at least one filter circuit that has resonator cascade gaps of a constant length.

FIG. 7-2 is a graph illustrating an example reflection coefficient corresponding to at least one filter circuit that has resonator cascade gaps of different lengths in accordance with the principles described herein.

DETAILED DESCRIPTION

Introduction and Overview

Figure 1:
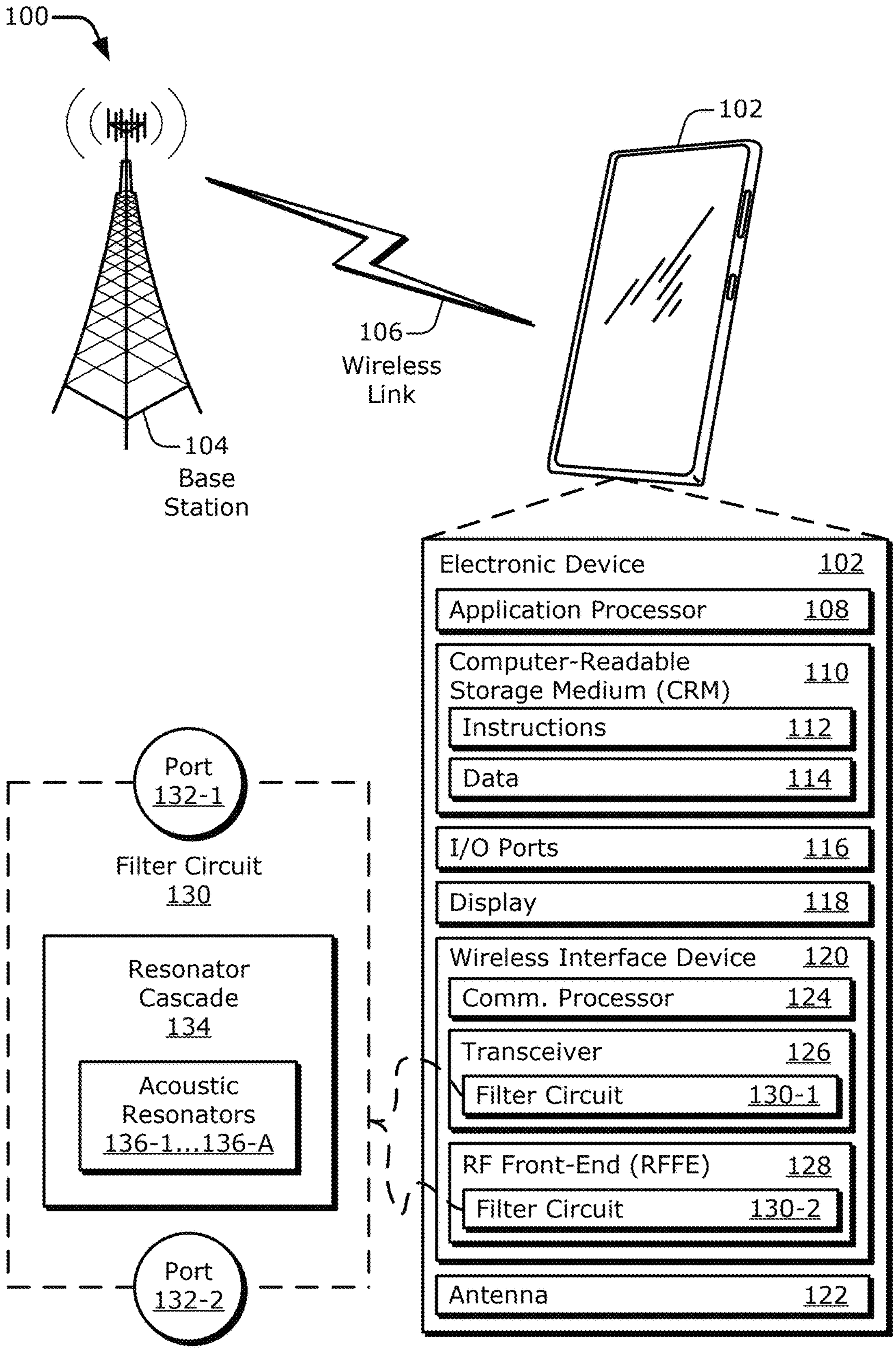
FIG. 1 illustrates an environment with an example electronic device that has a wireless interface device, which includes at least one example filter circuit.

To facilitate transmission and reception of wireless signals, an electronic device can use a wireless interface device that includes a wireless transceiver and/or a radio-frequency (RF) front-end. Electronic devices communicate with wireless signals using electromagnetic (EM) signals in various frequencies that exist on a portion of the EM spectrum. These wireless signals may travel between two electronic devices at a particular frequency, such as a kilohertz (kHz) frequency, a megahertz (MHz) frequency, or a gigahertz (GHz) frequency. The EM spectrum is, however, a finite resource that limits how many signals can be simultaneously communicated in any given spatial area. There are already billions of electronic devices that use this limited resource. To enable a greater number of simultaneous communications using EM signaling, the finite EM spectrum can be shared among electronic devices. The EM spectrum can be shared using, for instance, frequency division multiplexing (FDM) and/or time division multiplexing (TDM) techniques.

Techniques for FDM or TDM can entail separating the EM spectrum into different frequency bands and constraining communications to occur within an assigned frequency band. Signals in different frequency bands can be communicated at the same time in a same area without significantly interfering with each other. To transmit a signal within a target frequency band, a transmitter can apply a filter to the signal. The filter passes the frequencies of the target frequency band and suppresses (e.g., attenuates, reduces, or blocks) other frequencies. Thus, filters can support FDM and/or TDM techniques to facilitate efficient sharing of the EM spectrum.

A wireless transceiver or an RF front-end of an electronic device can include a filter that passes the desired frequencies of a signal within a target frequency band but suppresses the undesired ones outside of the band. Some filters use combinations of inductors and capacitors to suppress frequencies. Other filters use acoustic resonators, like a bulk acoustic wave (BAW) resonator or a surface acoustic wave (SAW) resonator, to filter frequencies using a piezoelectric material. Each acoustic resonator may be associated with a resonant frequency that corresponds to which frequency or frequencies can be passed or suppressed using the acoustic resonator. Filters can also include one or more transformers to act as a balun to process balanced and unbalanced signals.

Thus, filters can use, for example, transformers, acoustic resonators, capacitors, and/or inductors to achieve a desired filter response. Further, some electronic devices have multiple instances of such filters to enable communication across different frequency bands. Consequently, an electronic device can include numerous instances of any of these components. Each of these components, however, has an associated financial cost in terms of both bill of material (BOM) and manufacturing, such as fabrication or assembly efforts. Each component also has a corresponding spatial cost in terms of a physical size that occupies some area or volume within a housing of an electronic device. An additional expense or an increased size may be particularly relevant factors for price-sensitive or mobile devices.

It can, therefore, be advantageous to place filters relatively closer to each other within a device to reduce a total area or volume occupied by some quantity of filtering components and/or to enable some filtering components to share common aspects, such as a printed circuit board (PCB) or a substrate. Compacting a space occupied by some quantity of filter-related components that are employed within an electronic device can thus lower the cost of an electronic device and enable it to have a smaller form factor for easer portability. Nonetheless, cost and size are not the only factors to be considered when designing filters.

Filters are also expected to meet certain other parameters to achieve a desired level of filter performance. Such other parameters can include frequency response, noise suppression, in-band performance, out-of-band suppression, combinations thereof, and so forth. Implementations for filters are described below that can balance these various factors of cost, size, and filter performance to meet various specifications for wireless electronic devices, such as mobile devices, access points, and base stations.

With Fifth-Generation (5G) and forthcoming Sixth-Generation (6G) technologies, filters that service numerous frequency bands may be "crowded" into a single device. For example, to support carrier aggregation (CA) in which a communication can involve signaling across multiple carrier frequencies to increase bandwidth, a device may include additional filter circuits. These filter circuits occupy space. As noted above, an example type of filter circuit includes one or more acoustic resonators. Because acoustic resonators operate in conjunction with a piezoelectric material, filter circuits that use acoustic resonators may be co-located on a same piece of piezoelectric material or other substrate layer material.

Acoustic resonators can filter frequencies of RF signals using sound waves. An acoustic resonator converts an RF signal to a sound wave signal, filters the converted sound wave signal using the piezoelectric material, and reconverts the filtered sound wave signal to a filtered RF signal. In some circumstances, multiple acoustic resonators are coupled together into a resonator cascade, such as by coupling them together in series. Two or more resonator cascades may be disposed proximately to each another on a substrate.

Consider a first resonator cascade in which the multiple acoustic resonators thereof are disposed on the substrate in a column along a first axis (e.g., a first dimension or direction). A second resonator cascade is disposed some distance away along a second axis that is perpendicular to the first axis. The second resonator cascade also includes multiple acoustic resonators disposed on the substrate in a second column along the first axis. Each axis may be a virtual axis or otherwise not be physically realized or produced on the substrate or in a portion of the resonator cascade.

During operation of the first resonator cascade, bulk waves travel in the substrate underneath the multiple resonators of the first resonator cascade. These bulk waves propagate through the substrate from the first resonator cascade to a "backside" of the substrate, reflect off the backside of the substrate, and reach the second resonator cascade. Upon reaching the second resonator cascade, the reflected bulk waves couple with the multiple acoustic resonators thereof by creating spurious modes that interfere with the filtering operation. In some cases, the reflected bulk waves can "constructively" interfere at the second resonator cascade and therefore produce more harmful spurious modes. This interference can also be bidirectional so as to also be occurring at the first resonator cascade due to reflected bulk waves generated by the second resonator cascade.

In one approach to handling bulk wave reflections between two resonator cascades, the second resonator cascade can be shifted along the first axis away from the first resonator cascade. For example, the second resonator cascade can be shifted sufficiently along the first axis away from the first resonator cascade such that no line parallel to the second axis can cross the first and second resonator cascades. In such cases, lateral bulk waves emanating from the first resonator cascade may be less concentrated at the second resonator cascade due to the directionality of the bulk wave signal propagation. With this approach, however, the two resonator cascades can occupy twice the area on the substrate, and this larger area increases size and cost of the device.

In another approach to handling bulk wave reflections between two resonator cascades, a substrate on which a resonator cascade is disposed can be treated with or mated to a dampening material at the backside of the substrate. This material can dampen reflected bulk waves. Accordingly, reflected bulk waves from a first resonator cascade that do reach a second resonator cascade may have an appreciably lower power and therefore create less interference. With this approach, however, manufacturing time and/or costs increase due to application of the dampening material to the backside of the substrate.

Other approaches are presented herein to combat the higher interference that bulk wave reflections between two resonator cascades can create. This document describes techniques and approaches that create gaps of varying lengths between acoustic resonators of two different resonator cascades, such as first and second resonator cascades, to reduce the interference. The acoustic resonators of at least one resonator cascade, such as those of the second resonator cascade, can be spatially shifted along the second axis by different amounts. This spatial shifting results in gaps having different lengths between respective acoustic resonators of the first resonator cascade and respective acoustic resonators of the second resonator cascade. Accordingly, waves of the reflected bulk waves from the acoustic resonators of the first resonator cascade arrive at the acoustic resonators of the second resonator cascade with different phases after different travel times due to the different lengths of the various gaps.

By arriving with different phases, these reflected bulk waves interfere at the second resonator cascade to a lesser degree. Similarly, reflected bulk waves from the second resonator cascade interfere less at the first resonator cascade. Thus, by creating gaps of different lengths between two or more acoustic resonators of two neighboring resonator cascades, the described techniques and approaches can reduce undesirable spurious modes in resonator cascades that are operating as filters. Additional example implementations are described herein. For instance, at least one acoustic resonator in each of two neighboring resonator cascades can be spatially shifted from a common alignment to establish two or more gaps having varying lengths between two or more acoustic resonators of the two neighboring resonator cascades.

Description Examples

FIG. 1 illustrates an example environment 100 with an electronic device 102 that has a wireless interface device 120, which includes at least one example filter circuit 130. This document describes example implementations of the filter circuit 130, which may be part of a transceiver, a radio-frequency front-end (RFFE), and so forth of an apparatus. In the environment 100, the example electronic device 102 communicates with a base station 104 through a wireless link 106. In FIG. 1, the electronic device 102 is depicted as a smartphone. The electronic device 102, however, may be implemented as any suitable computing or other electronic device. Examples of an apparatus that can be realized as an electronic device 102 include a cellular base station, broadband router, access point, cellular or mobile phone, gaming device, navigation device, media device, laptop computer, desktop computer, tablet computer, server computer, network-attached storage (NAS) device, smart appliance, vehicle-based communication system, Internet of Things (IoT) device, sensor or security device, asset tracker, fitness management device, wearable device such as intelligent glasses or smartwatch, wireless power device (transmitter or receiver), medical device, and so forth.

The base station 104 communicates with the electronic device 102 via the wireless link 106, which may be implemented as any suitable type of wireless link that carries a communication signal. Although depicted as a base station tower of a cellular radio network, the base station 104 may represent or be implemented as another device, such as a satellite, terrestrial broadcast tower, access point, peer-to-peer device, mesh network node, fiber optic line interface, another electronic device as described above generally, and so forth. Hence, the wireless link 106 can extend between the electronic device 102 and the base station 104 in any of various manners.

The wireless link 106 can include a downlink of data or control information communicated from the base station 104 to the electronic device 102. The wireless link 106 can also include an uplink of other data or control information communicated from the electronic device 102 to the base station 104. The wireless link 106 may be implemented using any suitable wireless communication protocol or standard. Examples of such protocols and standards include a 3$^{rd}$ Generation Partnership Project (3GPP) Long-Term Evolution (LTE) standard, such as a 4th Generation (4G), a 5th Generation (5G), or a 6$^{th}$ Generation (6G) cellular standard: an IEEE 802.11 standard, such as 802.11g, ac, ax, ad, aj, or ay standard (e.g., Wi-Fi® 6 or WiGig®); an IEEE 802.16 standard (e.g., WiMAX®): a Bluetooth®: standard: an ultra-wideband (UWB) standard (e.g., IEEE 802.15.4); and so forth. In some implementations, the wireless link 106 may provide power wirelessly, and the electronic device 102 or the base station 104 may comprise a power source.

As shown for some implementations, the electronic device 102 can include at least one application processor 108 and at least one computer-readable storage medium 110 (CRM 110). The application processor 108 may include any type of processor, such as a central processing unit (CPU) or a multi-core processor, that is configured to execute processor-executable instructions (e.g., code) stored by the CRM 110. The CRM 110 may include any suitable type of data storage media, such as volatile memory (e.g., random-access memory (RAM)), non-volatile memory (e.g., Flash memory), optical media, magnetic media (e.g., disk or tape), and so forth. In the context of this disclosure, the CRM 110 is implemented to store instructions 112, data 114, and other information of the electronic device 102, and thus the CRM 110 does not include transitory propagating signals or carrier waves.

The electronic device 102 may also include one or more input/output ports 116 (I/O ports 116) and at least one display 118. The I/O ports 116 enable data exchanges or interaction with other devices, networks, or users. The I/O ports 116 may include serial ports (e.g., universal serial bus (USBR) ports), parallel ports, ethernet ports, audio ports, infrared (IR) ports, cameras or other sensor ports, and so forth. The display 118 can be realized as a display screen or a projection that presents graphical images provided by other components of the electronic device 102, such as a user interface (UI) associated with an operating system, program, or application. Alternatively or additionally, the display 118 may be implemented as a display port or virtual interface through which graphical content of the electronic device 102 is communicated or presented.

The electronic device 102 further includes at least one wireless interface device 120 and at least one antenna 122. The example wireless interface device 120 provides connectivity to respective networks and peer devices via a wireless link, which may be configured similarly to or differently from the wireless link 106. The wireless interface device 120 may facilitate communication over any suitable type of wireless network, such as a wireless local area network (LAN) (WLAN), wireless personal-area-network (PAN) (WPAN), peer-to-peer (P2P) network, mesh network, cellular network, wireless wide-area-network (WAN) (WWAN), and/or navigational network (e.g., the Global Positioning System (GPS) of North America or another Satellite Positioning System (SPS) or Global Navigation Satellite System (GNSS)). In the context of the example environment 100, the electronic device 102 can communicate various data and control information bidirectionally with the base station 104 via the wireless interface device 120. The electronic device 102 may, however, communicate directly with other peer devices, an alternative wireless network, and the like. Also, as described above, an electronic device 102 may alternatively be implemented as a base station 104 or another apparatus as set forth herein.

As shown, the wireless interface device 120 can include at least one communication processor 124, at least one transceiver 126, and at least one radio-frequency front-end 128 (RFFE 128). These components process data information, control information, and signals associated with communicating information for the electronic device 102 via the antenna 122. The communication processor 124 may be implemented as at least part of a system-on-chip (SoC), as a modem processor, or as a baseband radio processor (BBP) that enables a digital communication interface for data, voice, messaging, or other applications of the electronic device 102. The communication processor 124 can include a digital signal processor (DSP) or one or more signal-processing blocks (not shown) for encoding and modulating data for transmission and for demodulating and decoding received data. Additionally, the communication processor 124 may also manage (e.g., control or configure) aspects or operation of the transceiver 126, the RF front-end 128, and other components of the wireless interface device 120 to implement various communication protocols or communication techniques.

In some cases, the application processor 108 and the communication processor 124 can be combined into one module or integrated circuit (IC), such as an SoC. Regardless, the application processor 108, the communication processor 124, or a processor generally can be operatively coupled to one or more other components, such as the CRM 110 or the display 118, to enable control of, or other interaction with, the various components of the electronic device 102. For example, at least one processor 108 or 124 can present one or more graphical images on a display screen implementation of the display 118 based on one or more wireless signals transmitted or received via the at least one antenna 122 using components of the wireless interface device 120. Further, the application processor 108 or the communication processor 124, including a combination thereof, can be realized using digital circuitry that implements logic or functionality that is described herein. Additionally, the communication processor 124 may also include or be associated with a memory (not separately depicted) to store data and processor-executable instructions (e.g., code), such as the same or another CRM 110.

As shown, the wireless interface device 120 can include at least one filter circuit 130, which is described below. More specifically, the transceiver 126 can include at least one filter circuit 130-1, or the RF front-end 128 can include at least one filter circuit 130-2 (including both components can have at least one filter circuit 130 in accordance with an optional but permitted inclusive-or interpretation of the word “or”). The transceiver 126 can also include circuitry and logic for filtering, switching, amplification, channelization, frequency translation, and so forth. Frequency translation functionality may include an up-conversion or a down-conversion of frequency that is performed through a single conversion operation (e.g., with a direct-conversion architecture) or through multiple conversion operations (e.g., with a super-heterodyne architecture). Generally, the transceiver 126 can include filters, switches, amplifiers, mixers, and so forth for routing and conditioning signals that are transmitted or received via the antenna 122.

In addition to the filter circuit 130-1, the transceiver 126 can include an analog-to-digital converter (ADC) or a digital-to-analog converter (DAC) (not shown in FIG. 1). In operation, an ADC can convert analog signals to digital signals, and a DAC can convert digital signals to analog signals. Generally, an ADC or a DAC can be implemented as part of the communication processor 124, as part of the transceiver 126, or separately from both (e.g., as another part of an SoC or as part of the application processor 108).

Figures 1, 2:
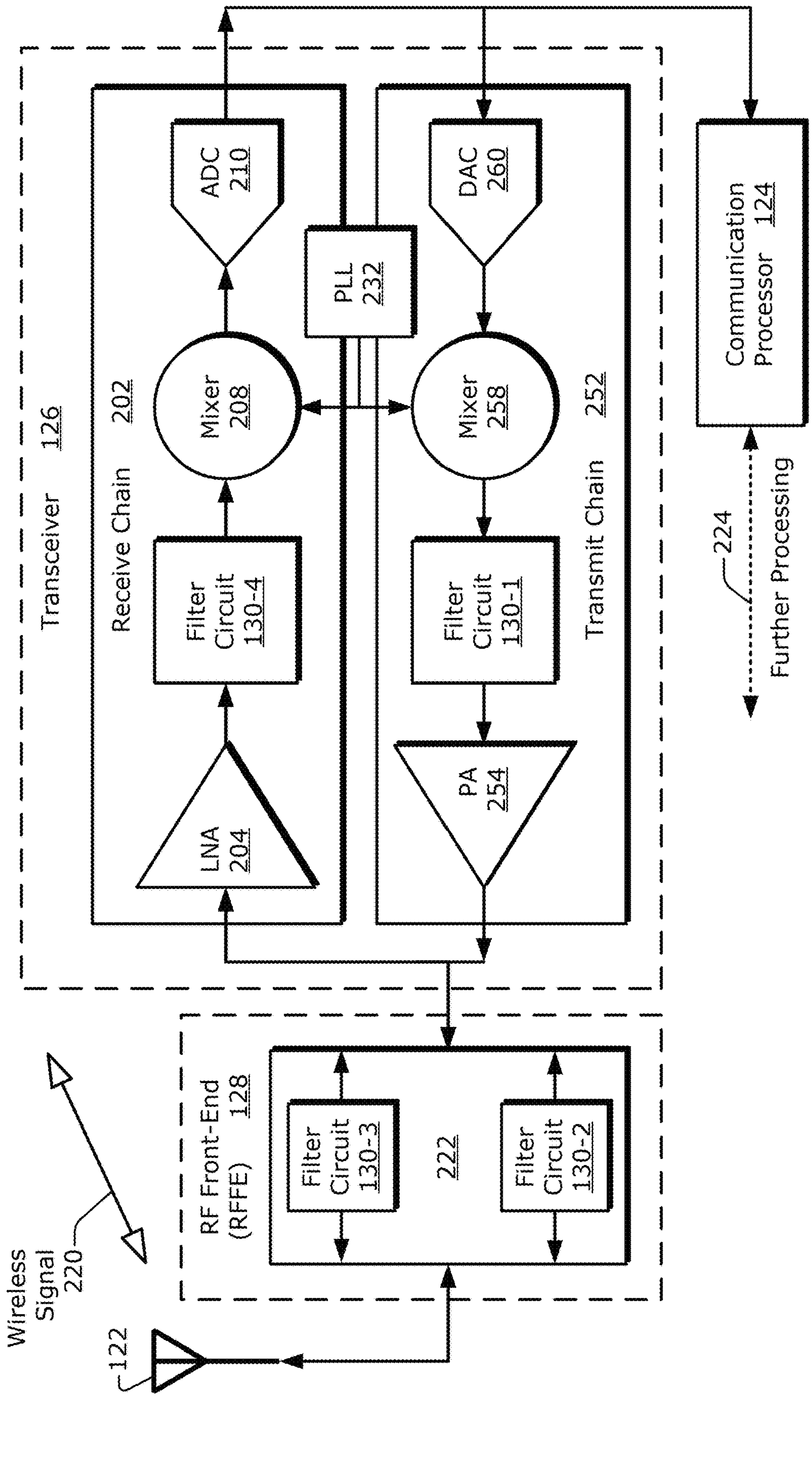
Figure 2:
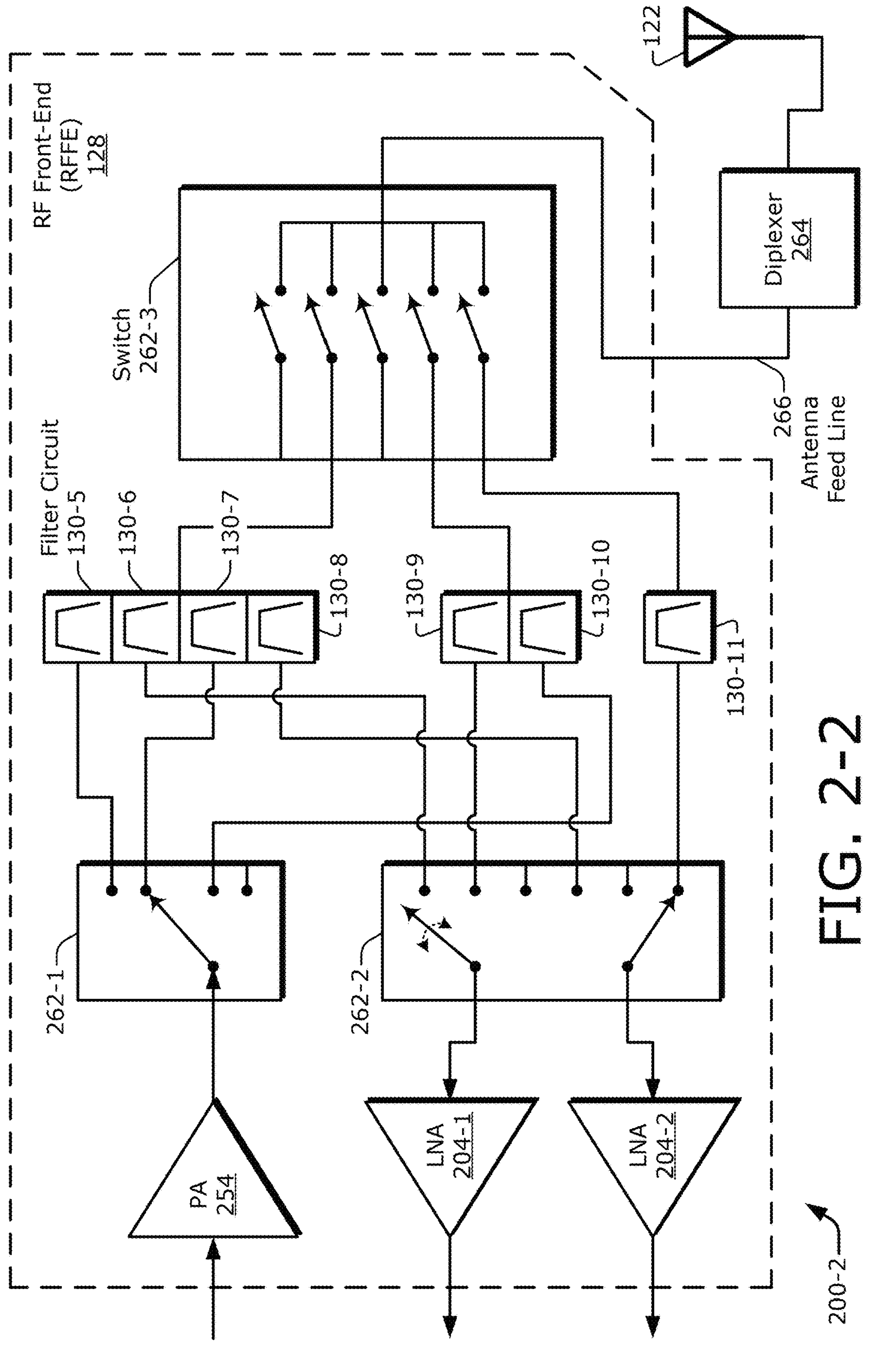

The components or circuitry of the transceiver 126 can be implemented in any suitable fashion, such as with combined transceiver logic or separately as respective transmitter and receiver entities. In some cases, the transceiver 126 is implemented with multiple or different sections to implement respective transmitting and receiving operations (e.g., with separate transmit and receive chains as depicted in FIG. 2). Although not shown in FIG. 1, the transceiver 126 may also include logic to perform in-phase/quadrature (I/Q) operations, such as synthesis, phase correction, modulation, demodulation, and the like.

The RF front-end 128 can include one or more filters-such as the filter circuit 130-2—multiple switches, or one or more amplifiers for conditioning signals received via the antenna 122 or for conditioning signals to be transmitted via the antenna 122. The RF front-end 128 may also include a phase shifter (PS), peak detector, power meter, gain control block, antenna tuning circuit, N-plexer, balun, and the like. Configurable components of the RF front-end 128, such as some phase shifters, an automatic gain controller (AGC), or an adjustable/switchable filter circuit, may be controlled by the communication processor 124 to implement communications in various modes, with different frequency bands and/or carrier aggregation (CA), or using beamforming. In some implementations, the antenna 122 is implemented as at least one antenna array that includes multiple antenna elements. Thus, as used herein, an “antenna” can refer to at least one discrete or independent antenna, to at least one antenna array that includes multiple antenna elements, or to a portion of an antenna array (e.g., an antenna element), depending on context or implementation.

In FIG. 1, an example filter circuit 130 is depicted as being part of a transceiver 126 as a filter circuit 130-1, as being part of an RF front-end 128 as a filter circuit 130-2, and so forth. Described implementations of a filter circuit 130 can, however, additionally or alternatively be employed in other portions of the wireless interface device 120 or in other portions of the electronic device 102 generally. As set forth above, a filter circuit 130 can be included in an electronic device other than a cell phone, such as a base station 104. With a base station (or a mobile phone), a filter of, e.g., an intermediate frequency (IF) section of a wireless interface device 120 and/or an RF front-end 128 may include a filter circuit 130 as described herein. Other electronic device apparatuses that can employ a filter circuit 130 include a laptop, communication hardware of a vehicle, a wireless access point, and so forth as described herein.

In example implementations, the filter circuit 130 can include at least one port 132, at least one resonator cascade 134, and multiple acoustic resonators 136-1 . . . 136-A, with “A” representing an integer greater than one. As illustrated, the filter circuit 130 can include a first port 132-1 and a second port 132-2. In some cases, one port can operate as an input port, and the other port can operate as an output port for the filter circuit 130. These input/output statuses may be switched during operation, however, for a bidirectional filter circuit 130. Although two ports 132-1 and 132-2, one resonator cascade 134, and “A” acoustic resonators 136-1 . . . 136-A are explicitly depicted in FIG. 1, the filter circuit 130 may include more or fewer of any of such components, as well as other components that are not shown.

A filter circuit 130 can include two resonator cascades (not shown in FIG. 1). Additionally or alternatively, each filter circuit 130 of two such filter circuits may include at least one respective resonator cascade 134. In any of such cases, at least one of the two resonator cascades 134 includes one or more spatially shifted acoustic resonators 136 to create gaps of varying lengths between different acoustic resonators 136 of the two resonator cascades. Example implementations of gap length variability are described below with reference to FIGS. 6-1 to 6-5. Example structures of at least one acoustic resonator 136 are described below with reference to FIGS. 4 and 5. An example resonator cascade 134 is described with reference to FIG. 3. Next, however, this document describes example implementations of a transceiver and an RF front-end with reference to FIGS. 2-1 and 2-2.

FIG. 2-1 is a schematic diagram 200-1 illustrating an example RF front-end 128 and an example transceiver 126 that can each include at least one filter circuit 130. FIG. 2-1 also depicts an antenna 122 and a communication processor 124. The communication processor 124 communicates one or more data signals to other components, such as the application processor 108 of FIG. 1, for further processing at 224 (e.g., for processing at an application level). As shown, the circuitry 200-1 can include a filter circuit 130-1, a filter circuit 130-2, a filter circuit 130-3, or a filter circuit 130-4, including one to four of such filter circuits. The circuitry 200-1, however, may include a different quantity of filters (e.g., more or fewer), may include filters that are coupled together differently, may include filters in different locations, may include filters that are implemented as a duplexer or quadplexer, and so forth.

As illustrated from left to right, in example implementations, the antenna 122 is coupled to the RF front-end 128, and the RF front-end 128 is coupled to the transceiver 126. The transceiver 126 is coupled to the communication processor 124. The example RF front-end 128 includes at least one signal propagation path 222. The at least one signal propagation path 222 can include at least one filter circuit 130, such as the filter circuit 130-2 and the filter circuit 130-3. The example transceiver 126 includes at least one receive chain 202 (or receive path 202) and at least one transmit chain 252 (or transmit path 252). Although only one RF front-end 128, one transceiver 126, and one communication processor 124 are shown at the circuitry 200-1, an electronic device 102, or a wireless interface device 120 thereof, can include multiple instances of any or all such components. Also, although only certain components are explicitly depicted in FIG. 2 and are shown coupled together in a particular manner, the transceiver 126 or the RF front-end 128 may include other non-illustrated components (e.g., switches or diplexers), more or fewer components, differently coupled arrangements of components, and so forth.

In some implementations, the RF front-end 128 couples the antenna 122 to the transceiver 126 via the signal propagation path 222. In operation, the signal propagation path 222 carries a signal between the antenna 122 and the transceiver 126. During or as part of the signal propagation, the signal propagation path 222 conditions the propagating signal, such as with the filter circuit 130-2 or the filter circuit 130-3. This enables the RF front-end 128 to couple a wireless signal 220 from the antenna 122 to the transceiver 126 as part of a reception operation. The RF front-end 128 also enables a transmission signal to be coupled from the transceiver 126 to the antenna 122 as part of a transmission operation to emanate a wireless signal 220. Although not explicitly shown in FIG. 2-1, an RF front-end 128, or a signal propagation path 222 thereof, may include one or more other components, such as another filter, an amplifier (e.g., a power amplifier or a low-noise amplifier), an N-plexer, a phase shifter, a diplexer, one or more switches, and so forth.

In some implementations, the transceiver 126 can include at least one receive chain 202, at least one transmit chain 252, or at least one receive chain 202 and at least one transmit chain 252. From left to right, the receive chain 202 can include a low noise amplifier 204 (LNA 204), the filter circuit 130-4, a mixer 208 for frequency down conversion, and an ADC 210. The transmit chain 252 can include a power amplifier 254 (PA 254), the filter circuit 130-1, a mixer 258 for frequency up-conversion, and a DAC 260. However, the receive chain 202 or the transmit chain 252 can include other components—for example, additional amplifiers or filters, multiple mixers, one or more buffers, or at least one local oscillator—that are electrically or electromagnetically disposed anywhere along the depicted receive and transmit chains.

The receive chain 202 is coupled between the signal propagation path 222 of the RF front-end 128 and the communication processor 124—e.g., via the low-noise amplifier 204 and the ADC 210, respectively. The transmit chain 252 is coupled between the signal propagation path 222 and the communication processor 124—e.g., via the power amplifier 254 and the DAC 260, respectively. The transceiver 126 can also include at least one phase-locked loop 232 (PLL 232) that is coupled to the mixer 208 or the mixer 258. For example, the transceiver 126 can include one PLL 232 for each transmit/receive chain pair, one PLL 232 per transmit chain and one PLL 232 per receive chain, multiple PLLs 232 per chain, and so forth.

As shown along a signal propagation direction for certain example implementations of the receive chain 202, the antenna 122 is coupled to the low noise amplifier 204 via the signal propagation path 222 and the filter circuit 130-3 thereof. The low-noise amplifier 204 is coupled to the filter circuit 130-4. The filter circuit 130-4 is coupled to the mixer 208, and the mixer 208 is coupled to the ADC 210. The ADC 210 is in turn coupled to the communication processor 124. As shown along a signal propagation direction for certain example implementations of the transmit chain 252, the communication processor 124 is coupled to the DAC 260, and the DAC 260 is coupled to the mixer 258. The mixer 258 is coupled to the filter circuit 130-1, and the filter circuit 130-1 is coupled to the power amplifier 254. The power amplifier 254 is coupled to the antenna 122 via the signal propagation path 222 using the filter circuit 130-2 thereof. Although only one receive chain 202 and one transmit chain 252 are explicitly shown, an electronic device 102, or a transceiver 126 thereof, can include multiple instances of either or both components. Although the ADC 210) and the DAC 260 are illustrated as being separately coupled to the communication processor 124, they may share a bus or other means for communicating with the processor 124. Further, the ADC 210 or the DAC 260 may be part of the communication processor 124 or separate from the transceiver 126 and the communication processor 124.

As part of an example signal-receiving operation, the filter circuit 130-3 of the signal propagation path 222 filters a received signal and forwards the filtered signal to the low-noise amplifier 204. The low-noise amplifier 204 accepts the filtered signal from the RF front-end 128 and provides an amplified signal to the filter circuit 130-4 based on the accepted signal. The filter circuit 130-4 filters the amplified signal and provides another filtered signal to the mixer 208. The mixer 208 performs a frequency conversion operation on the other filtered signal to down-convert from one frequency to a lower frequency (e.g., from a radio frequency (RF) to an intermediate frequency (IF) or from RF or IF to a baseband frequency (BBF)). The mixer 208 can perform the frequency down-conversion in a single conversion step or through multiple conversion steps using at least one PLL 232. The mixer 208 can provide a down-converted signal to the ADC 210 for conversion and forwarding to the communication processor 124 as a digital signal.

As part of an example signal-transmitting operation, the mixer 258 accepts an analog signal at BBF or IF from the DAC 260. The mixer 258 upconverts the analog signal to a higher frequency, such as to an RF frequency, to produce an RF signal using a signal generated by the PLL 232 to have a target synthesized frequency. The mixer 258 provides the RF or other upconverted signal to the filter circuit 130-1. The filter circuit 130-1 filters the RF signal and provides a filtered signal to the power amplifier 254. Thus, after the filtering by the filter circuit 130-1, the power amplifier 254 amplifies the filtered signal and provides an amplified signal to the signal propagation path 222 for signal conditioning. The RF front-end 128 can use, for instance, the filter circuit 130-2 of the signal propagation path 222 to provide a filtered signal to the antenna 122 for emanation as a wireless signal 220.

Example implementations of a filter circuit 130, as described herein, may be employed at any one or more of the example filter circuits 130-1, 130-2, 130-3, or 130-4 in the transceiver 126 or the RF front-end 128 or at other filters of an electronic device 102 (not shown in FIG. 2-1). The circuitry 200-1, however, depicts just some examples for a transceiver 126 and/or an RF front-end 128. In some cases, the various components that are illustrated in the drawings using separate schematic blocks or circuit elements may be manufactured or packaged in different discrete manners. For example, one physical module may include components of the RF front-end 128 and some components of the transceiver 126, and another physical module may combine the communication processor 124 with the remaining components of the transceiver 126. Further, in some cases, the antenna 122 may be co-packaged with at least some components of the RF front-end 128 or the transceiver 126.

In alternative implementations, one or more components may be physically or logically "shifted" to a different part of the wireless interface device 120 as compared to the illustrated circuitry 200-1 and/or may be incorporated into a different module. For example, a low-noise amplifier 204 or a power amplifier 254 may alternatively or additionally be deployed in the RF front-end 128. Examples of this alternative are described next with reference to FIG. 2-2.

FIG. 2-2 is a schematic diagram 200-2 illustrating an example RF front-end 128 that can include one or more filter circuits coupled between at least one antenna 122 and one or more amplifiers, such as at least one low-noise amplifier (LNA) or at least one power amplifier (PA). As illustrated, the RF front-end 128 is coupled to the antenna 122 via an antenna feed line 266. Between the RF front-end 128 and the antenna 122, the antenna feed line 266 may include one or more components, such as a diplexer 264 (or a duplexer in some implementations where transmit (Tx) and receive (Rx) operations share the antenna 122). The RF front-end 128 can include a power amplifier 254, a first low-noise amplifier 204-1, and a second low-noise amplifier 204-2.

The RF front-end 128 can also include multiple switches, such as a first switch 262-1, a second switch 262-2, and a third switch 262-3. The first switch 262-1 is coupled along a transmit path of a signal propagation path 222 (of FIG. 2-1) of the RF front-end 128, and the second switch 262-2 is coupled along a receive path of another signal propagation path 222. The third switch 262-3 is coupled along the transmit path and the receive path in the illustrated example. Multiple transmit or receive signal propagation paths may be established at the same time or at different times using the switches.

In example implementations, the RF front-end 128 can further include multiple filter circuits, such as seven filter circuits 130-5 to 130-11. The three filter circuits 130-5, 130-7, and 130-10 can be used as part of a transmit path between the power amplifier 254 and the antenna 122, with the transmit path including the antenna feed line 266. The four filter circuits 130-6, 130-8, 130-9, and 130-11 can be used as part of a receive path between the antenna 122 and a low-noise amplifier 204, such as the first low-noise amplifier 204-1 or the second low-noise amplifier 204-2. Thus, the three filter circuits 130-5, 130-7, and 130-10 can filter a transmit signal that is output by the power amplifier 254. On the other hand, the four filter circuits 130-6, 130-8, 130-9, and 130-11 can filter a receive signal before the receive signal is input to the first or second low-noise amplifier 204-1 or 204-2.

Each filter circuit 130 can be realized as a standalone filter, a duplexer, a quadplexer, and so forth. As shown, the filter circuit 130-11 can operate as a standalone filter. The two filter circuits 130-9 and 130-10 can operate as a duplexer. The four filter circuits 130-5, 130-6, 130-7, and 130-8 can be configured as a quadplexer. By way of example only, the switch 262-2 is shown in a state in which the filter circuit 130-11 is coupled to an input of the second low-noise amplifier 204-2. The filter circuits, switches, amplifiers, and signal propagation paths can, however, be realized or operationally configured in different manners.

The transmit and receive paths can be established using one or more of the first, second, or third switches 262-1, 262-2, or 262-3. A controller (not shown), which may be part of the communication processor 124 (of FIGS. 1 and 2-1), can position or set the states of these switches based on transmit versus receive mode, a frequency being used for transmission or reception, and so forth. Although certain components are depicted in FIG. 2-2 in certain arrangements and described above in a particular manner, an RF front-end 128 can include different components, more or fewer components, different couplings or arrangements of the components, and so forth.

Figure 3:
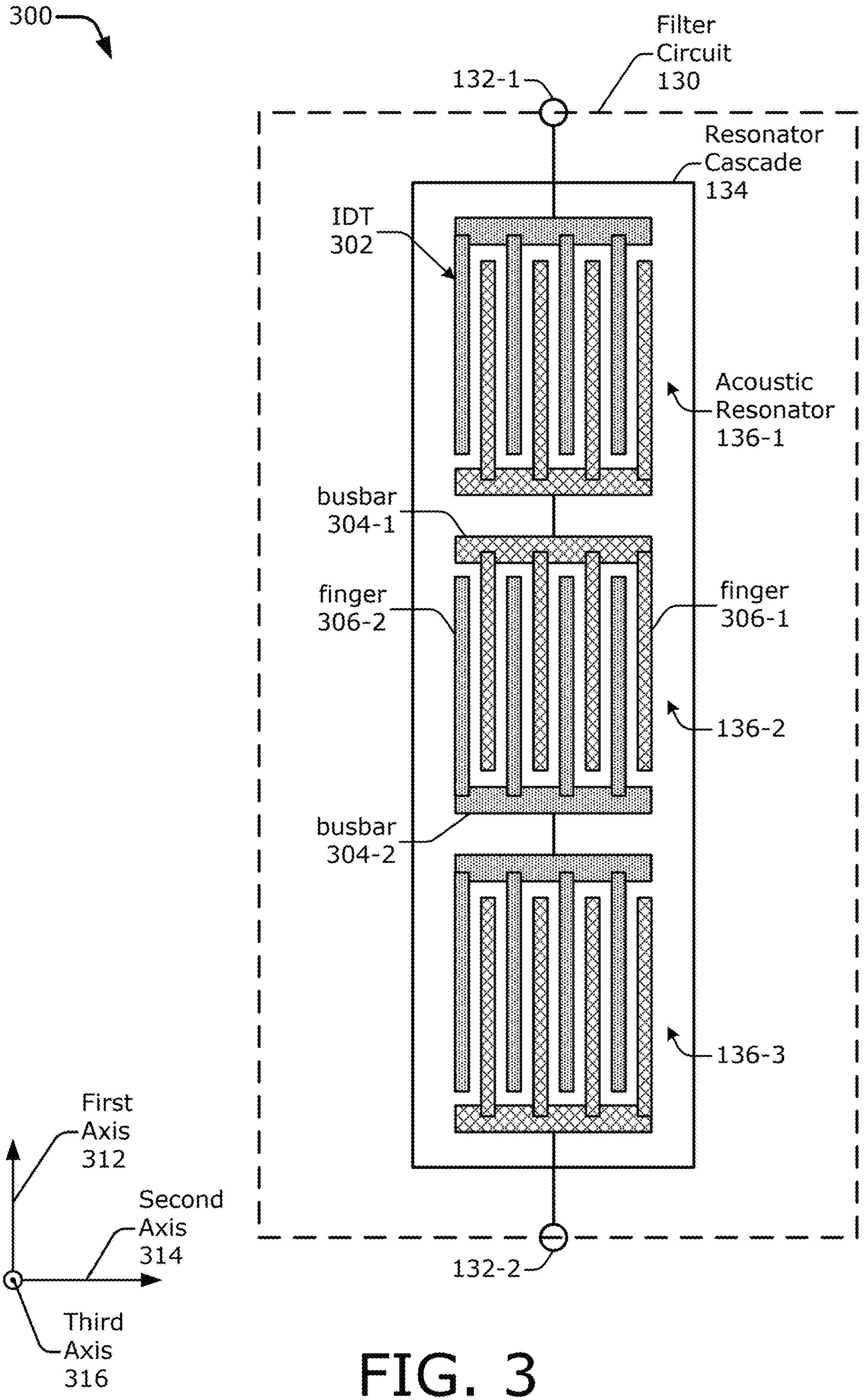
FIG. 3 is a schematic diagram illustrating an example resonator cascade including multiple acoustic resonators.

FIG. 3 is a schematic diagram 300 illustrating an example resonator cascade 134 including multiple acoustic resonators 136-1, 136-2, and 136-3. The resonator cascade 134 can be part of a filter circuit 130 as shown. Although the filter circuit 130 is depicted with a single resonator cascade 134, a filter circuit 130 may include multiple resonator cascades. Although the resonator cascade 134 is illustrated with three acoustic resonators 136-1, 136-2, and 136-3, a resonator cascade 134 may include two or more acoustic resonators of any quantity. Further, although each resonator 136 is depicted with a single interdigital transducer 302 (IDT 302) for clarity, each resonator 136 may include other components and/or be part of another component, which is described below.

A set of axes is also depicted at the lower left portion of FIG. 3. The set of axes includes a first axis 312, a second axis 314, and a third axis 316. Each axis may be substantially orthogonal to each other axis. For example, each axis may be perpendicular to each other axis at a precision corresponding to manufacturing tolerances for acoustic resonators. In some cases, two axes can be orthogonal if they are within five degrees (5°), three degrees (3°), or even one degree (1°) of being separated by ninety degrees (90°).

In example implementations, the multiple acoustic resonators 136-1 to 136-3 are coupled together in series between the first port 132-1 and the second port 132-2. As shown, a first acoustic resonator 136-1 is coupled to the first port 132-1, and a third acoustic resonator 136-3 is coupled to the second port 132-2. A second acoustic resonator 136-2 is coupled between the first acoustic resonator 136-1 and the third acoustic resonator 136-3. Generally, the multiple acoustic resonators 136-1 . . . 136-3 of the resonator cascade 134 can be disposed on the surface of a substrate in a first column along the first axis 312. Although not shown in FIG. 3, multiple acoustic resonators of another resonator cascade can be disposed on the surface of the same substrate in a second column along the first axis 312. The other resonator cascade is spaced apart from the depicted resonator cascade 134 along the second axis 314. Examples of such a spatial relationship, including with one or more gaps with different lengths between the two resonator cascades, are described below with reference to FIGS. 6-1 to 6-5. Although example physical arrangements are described in terms of a "column," this term is used to refer to these example physical arrangements because of the orientation of the drawings, which is by way of example only. A physical apparatus can be rotated in different orientations such that a "column" is equivalent to a "row," and vice versa.

As illustrated in FIG. 3, each acoustic resonator 136 includes at least one interdigital transducer 302 (IDT 302). Each interdigital transducer 302 can include two comb-like structures. A comb-like structure can include a busbar 304 and at least one finger 306. With reference to the second acoustic resonator 136-2, by way of example only, each acoustic resonator may include a first busbar 304-1 and a second busbar 304-2. The first busbar 304-1 may be coupled to multiple fingers, such as a first finger 306-1. The second busbar 304-2 may be coupled to multiple fingers, such as a second finger 306-2. Although only a few fingers (e.g., four) are shown per busbar 304 for clarity, a busbar may include from dozens (e.g., six to seven dozen) to hundreds (e.g., 100-400) of fingers (e.g., or approximately 100-800 fingers per resonator).

In some cases, although not illustrated as such in FIG. 3, each resonator 136 can include multiple components—e.g., in addition to an IDT 302 with multiple fingers 306. For example, a resonator 136 can include an IDT 302 and at least one reflector (not shown), such as a pair of reflectors. These three components can be coupled together with the IDT being between a first reflector and a second reflector (e.g., coupled together as follows: Reflector1+IDT+Reflector2). Additionally or alternatively, each resonator 136 may be part of a double-mode surface acoustic wave (SAW) (DMS) filter. A DMS filter may include multiple IDTs, multiple reflectors, multiple gaps, and so forth. For instance, a DMS filter may be coupled together as follows: Reflector1+IDT1+GAP1+IDT2+GAP2+ . . . +Reflector2+IDT3+GAP3+Reflector3. A DMS filter may, however, have other combinations of components and/or types of components, some instances of which have a respective reflector "terminating" each side.

Thus, a resonator cascade 134 may include multiple acoustic resonators 136-1 to 136-3 that each include reflectors as well as an IDT and/or that are part of another filter, such as a DMS filter. In such cases, the reflected bulk waves may cause interference with pairs of DMS filters in different resonator cascades if the multiple gaps have equal lengths. In accordance with described principles, however, the interference from reflected bulk waves may be reduced by implementing gaps of varying lengths between two or more respective DMS filter pairs that are part of respective resonator cascades.

Figure 4:
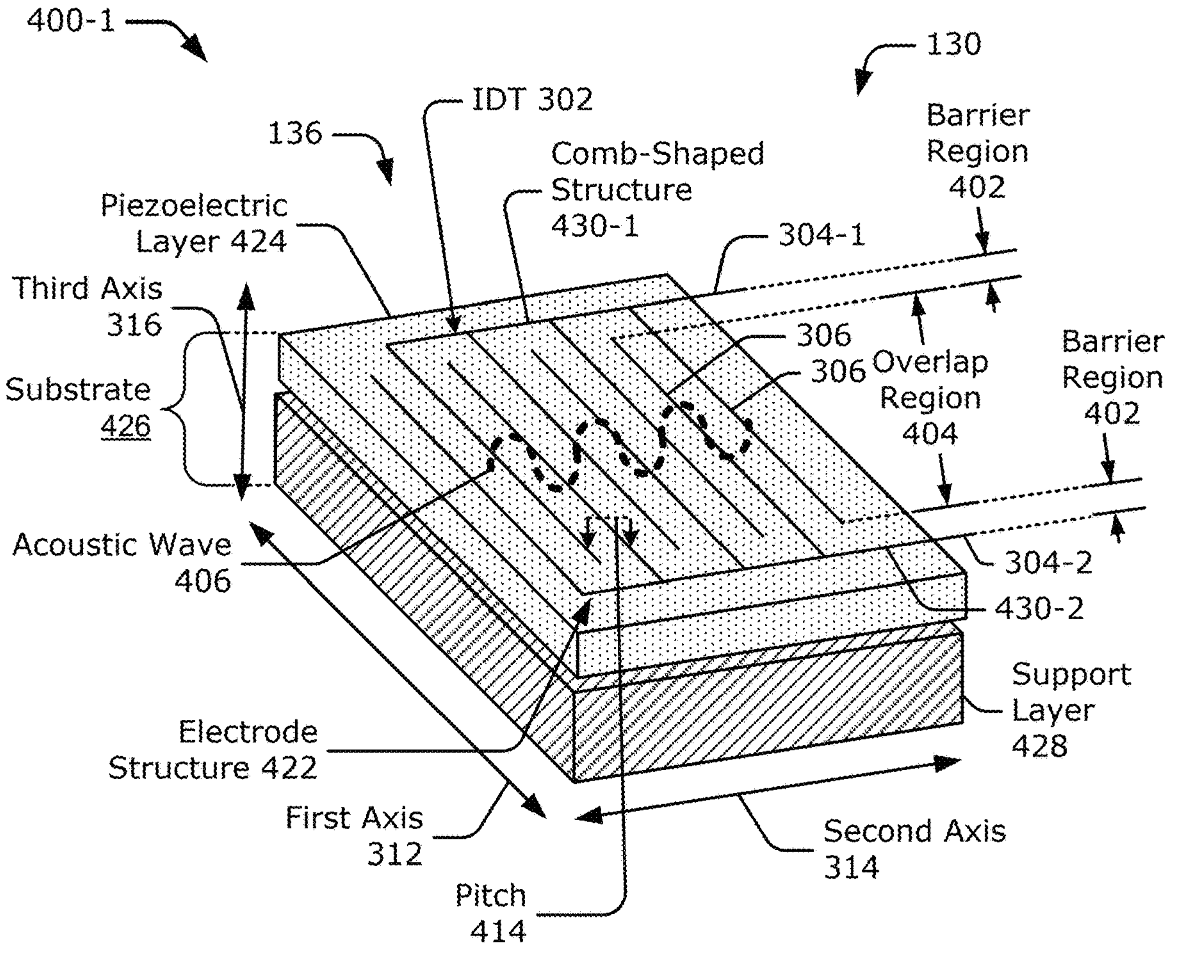
FIG. 4 illustrates an example implementation of a filter circuit with a perspective view and a cross-section view of an acoustic resonator.
Figure 4:
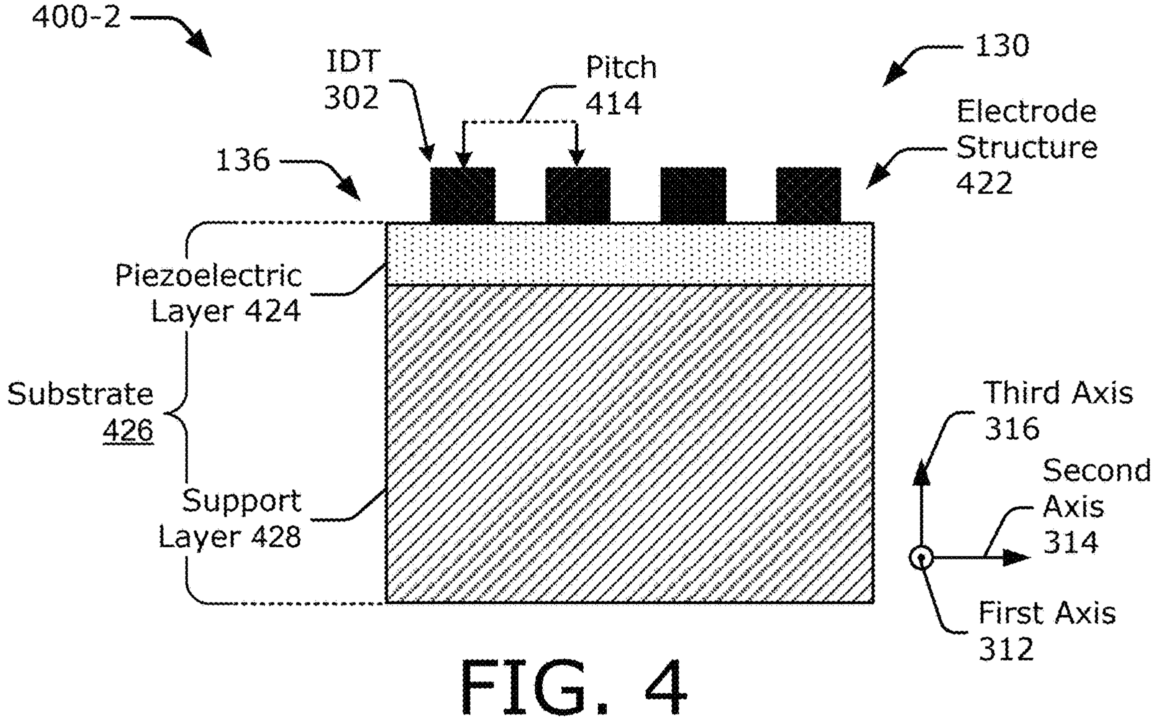

FIG. 4 illustrates an example implementation of a filter circuit 130 with a perspective view 400-1 and a cross-section view 400-2 of an example acoustic resonator 136. A three-dimensional perspective view 400-1 of the acoustic resonator 136 is shown at the upper portion of FIG. 4, and a two-dimensional cross-section view 400-2 of the acoustic resonator 136 is shown at the lower portion of FIG. 4.

The acoustic resonator 136 includes at least one electrode structure 422 and at least one substrate 426 (or substrate layer 426). The substrate 426 includes at least one piezoelectric layer 424 and may include one or more other layers, such as at least one support layer 428. In the depicted configuration shown in the two-dimensional cross-section view 400-2, the piezoelectric layer 424 is disposed between the electrode structure 422 and the support layer 428. The portion of the electrode structure 422 that is depicted in FIG. 4 includes at least a portion of one interdigital transducer 302. The electrode structure 422 can include additional interdigital transducers 302, such as if the acoustic resonator includes or is part of at least one DMS filter (not shown in FIG. 4). Also, the interdigital transducer 302 depicted in FIG. 4 can include additional fingers 306 not explicitly shown in FIG. 4.

In the three-dimensional perspective view 400-1, the interdigital transducer 302 is shown to have two comb-shaped structures 430-1 and 430-2 with fingers 306 extending towards each other from two busbars 304, such as a first busbar 304-1 and a second busbar 304-2. The fingers 306 are arranged in an interlocking manner in between the first and second busbars 304-1 and 304-2 of the interdigital transducer 302 (e.g., arranged in an interdigitated manner). In other words, the fingers 306 connected to the first busbar 304-1 extend towards the second busbar 304-2 but do not connect to the second busbar 304-2. As such, there can be a barrier region 402 (e.g., a transversal gap region) between the second busbar 304-2 and the ends of the fingers 306 that extend from the first busbar 304-1. Likewise, fingers 306 connected to the second busbar 304-2 extend towards the first busbar 304-1 but do not connect to the first busbar 304-1. There can therefore be another barrier region 402 between the ends of these fingers 306 and the first busbar 304-1.

In a direction along the first axis 312 that is perpendicular to the second axis 314 and between the two busbars 304, there is an overlap region 404 where a portion of one finger 306 overlaps with a portion of an adjacent finger 306. This overlap region 404 may be referred to as the aperture, track, or active region where electric fields are produced between fingers 306 to cause an acoustic wave 406 to form at least in this region of the piezoelectric layer 424. As part of the substrate 426, the support layer 428, if present, can support the piezoelectric layer 424 from any direction (e.g., from "above" or "below" the piezoelectric layer 424). The substrate 426 may also include one or more other layers positioned between the piezoelectric layer 424 and the support layer 428 or positioned on a side of the support layer 428 that is opposite a side thereof that is closest to the piezoelectric layer 424. In some cases, the substrate 426 may have no additional layer or layers besides the piezoelectric layer 424. Additionally or alternatively, one or more other layers may be disposed between the piezoelectric layer 424 and the electrode structure 422, such as a dielectric layer or another type of layer (e.g., including aluminium oxide ($Al_2O_3$)). Such a layer or layers may be, for instance, a few nanometers (nm) thick and may be part of or separate from the substrate 426.

With reference also to the two-dimensional cross-section view 400-2, a physical periodicity of the fingers 306 is referred to as a pitch 414 of the interdigital transducer 302. The pitch 414 may be indicated in various ways. For example, in certain aspects, the pitch 414 may correspond to a magnitude of a distance between adjacent fingers 306 of the interdigital transducer 302 in the overlap region 404. This distance may be defined, for example, as the distance between center points of each of the fingers 306. The distance may be generally measured between a right (or left) edge of one finger 306 and a right (or left, respectively) edge of an adjacent finger 306 when the fingers 306 have uniform widths. In certain aspects, an average of distances between adjacent fingers 306 of the interdigital transducer 302 may be used for the pitch 414. The main resonance frequency of the acoustic resonator 136 can depend on multiple parts of "the stack" of components, such as on the electrode structure 422, the piezoelectric layer 424, and any other layers, such as the support layer 428. For example, the main resonance frequency may be determined, at least in part, from or by the pitch 414 of the interdigital transducer 302, as well as other properties of the acoustic resonator 136, like characteristics of the substrate 426.

In the three-dimensional perspective view 400-1 and the two-dimensional cross-section view 400-2, example applications of the three axes of FIG. 3 are depicted. The first axis 312 and the second axis 314 are parallel to a planar surface of the piezoelectric layer 424 of the substrate 426, and the first axis 312 is substantially orthogonal to the second axis 314. The third axis 316 is normal (e.g., perpendicular or orthogonal) to the planar surface of the piezoelectric layer 424. The busbars 304 of the interdigital transducer 302 are oriented to be parallel to the second axis 314. The fingers 306 of the interdigital transducer 302 are orientated to be parallel to the first axis 312. These orientations may, however, be swapped. Also, an orientation of the piezoelectric layer 424 can cause the acoustic wave 406 to mainly form in a direction of the second axis 314. As such, the acoustic wave 406 forms in a direction that is substantially perpendicular or orthogonal to the direction of the fingers 306 of the interdigital transducer 302. The axes can, however, be applied to the filter circuit 130 or be defined differently than is illustrated in FIG. 4 or in the various other drawings.

One of ordinary skill in the art can appreciate the variety of structures, materials, and geometries in which a resonator cascade having multiple acoustic resonators can be implemented. It should be appreciated that while a certain quantity of fingers 306 are illustrated in the drawings (e.g., at FIGS. 3, 4, and 5), the quantity of actual fingers and the lengths and width of the fingers 306 and busbars 304 may be different in an actual implementation. Such parameters may depend on the particular application and desired filter characteristics. In addition, a filter circuit 130 or a resonator cascade 134 can include multiple interdigital transducers 302 to achieve a desired filter transfer function. An example structure having a substrate 426 that is shared with multiple resonator cascades 134 is described next with reference to FIG. 5.

Figure 5:
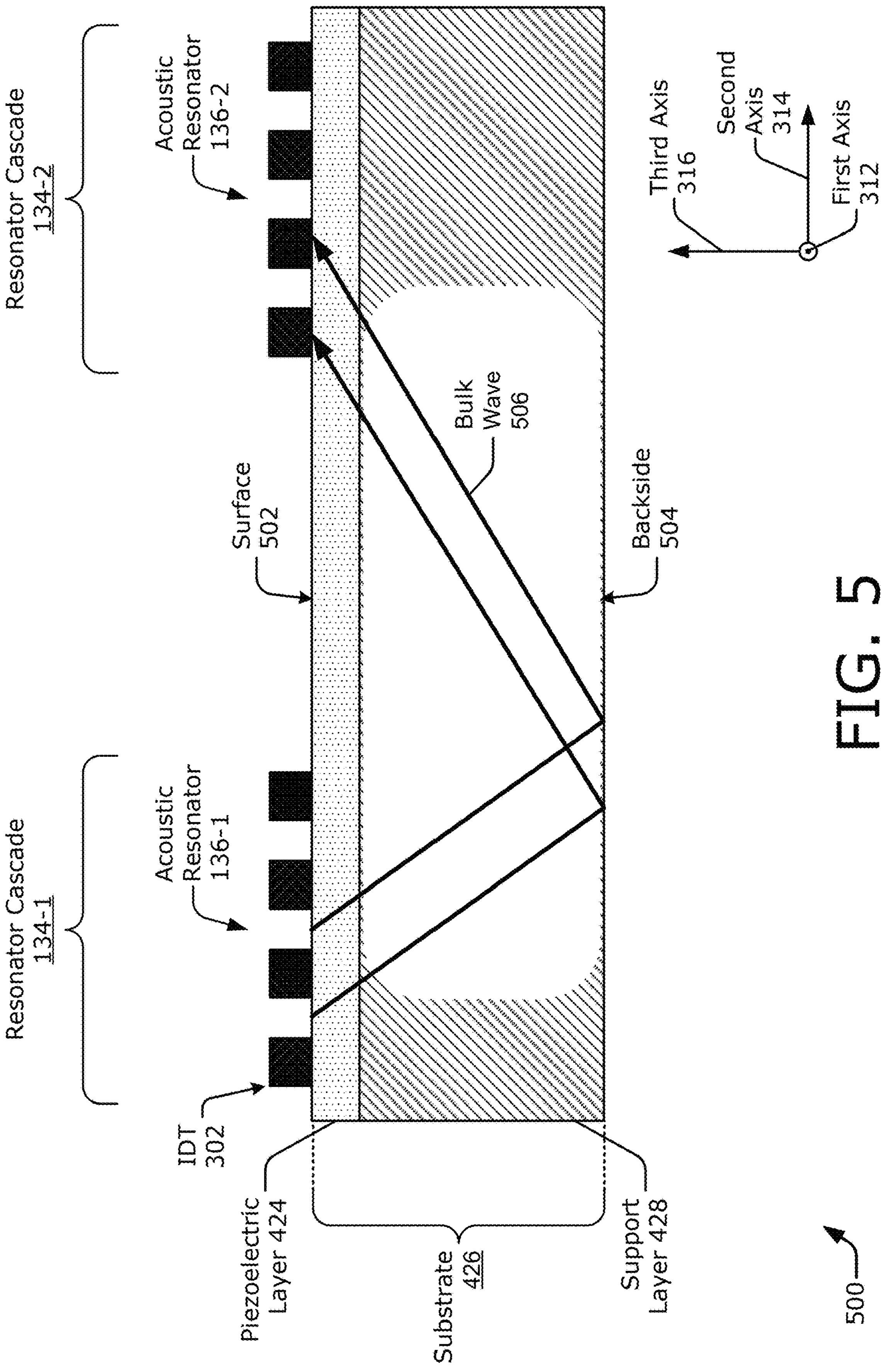
FIG. 5 illustrates in a cross-section view an example implementation of two acoustic resonators that can be part of two different resonator cascades in which bulk waves travel within a shared substrate from one resonator cascade to the other.

FIG. 5 illustrates in a cross-section view 500 an example implementation of two acoustic resonators that can be part of two different resonator cascades in which bulk waves travel within a shared substrate 426 from one resonator cascade 134 to the other. In example implementations, a first resonator cascade 134-1 includes multiple acoustic resonators, one of which is visible: a first acoustic resonator 136-1. A second resonator cascade 134-2 also includes multiple acoustic resonators, one of which is visible: a second acoustic resonator 136-2. In some cases, each acoustic resonator 136 can include at least shared piezoelectric material from at least one piezoelectric layer 424 of the substrate 426.

As illustrated, the substrate 426 (or substrate layer 426) can include a surface 502 and a backside 504 that is opposite the surface 502. In some cases, the surface 502 is substantially planar and is substantially parallel to the backside 504. Two surfaces or sides may be substantially parallel if, for example, they are made parallel within available manufacturing capabilities/tolerances or they are within one percent (1%), three percent (3%), or even five percent (5%) of being parallel. The first acoustic resonator 136-1 of the first resonator cascade 134-1 is disposed on the surface 502 of the piezoelectric layer 424 of the substrate 426. The second acoustic resonator 136-2 of the second resonator cascade 134-2 is also disposed on the surface 502 of the piezoelectric layer 424 of the substrate 426. If the substrate 426 does not include another layer (e.g., lacks or omits a support layer 428), the backside 504 of the substrate 426 can correspond to the backside of the piezoelectric layer 424 opposite the surface 502.

During example operations, the electromagnetic signaling in the IDTs of the first acoustic resonator 136-1 generate one or more bulk waves 506 that travel through the bulk material of the substrate 426. For instance, bulk waves 506 can be excited, and energy may leak into the substrate 426. The bulk waves 506 are reflected off the backside 504 of the substrate 426 and can resurface at a different acoustic resonator 136, such as the second acoustic resonator 136-2. If two acoustic resonators are located along a line of the second axis 314 at a same value of the first axis 312, the reflected bulk waves 506 can couple to the IDTs of the second acoustic resonator 136-2. This can occur even if the two acoustic resonators are separated by a gap that extends along the second axis 314. The coupling may create unwanted spurious modes in the second acoustic resonator 136-2. Further, this process can be reciprocal. In other words, operation of the second acoustic resonator 136-2 may create spurious modes in the first acoustic resonator 136-1.

As described herein, the bulk waves 506 can "constructively" interfere at the second resonator cascade 134-2 across multiple acoustic resonators to worsen the interference and produce significant spurious modes. This effect can be relatively greater if the gaps between the multiple acoustic resonators of the two resonator cascades all have a same length, which occurs with the use of standard design tools. Accordingly, this document describes fabricating the acoustic resonators of the two resonator cascades to be separated by gaps of different lengths to lower the interference. This is described next with reference to FIGS. 6-1 to 6-5.

Figures 1, 6:
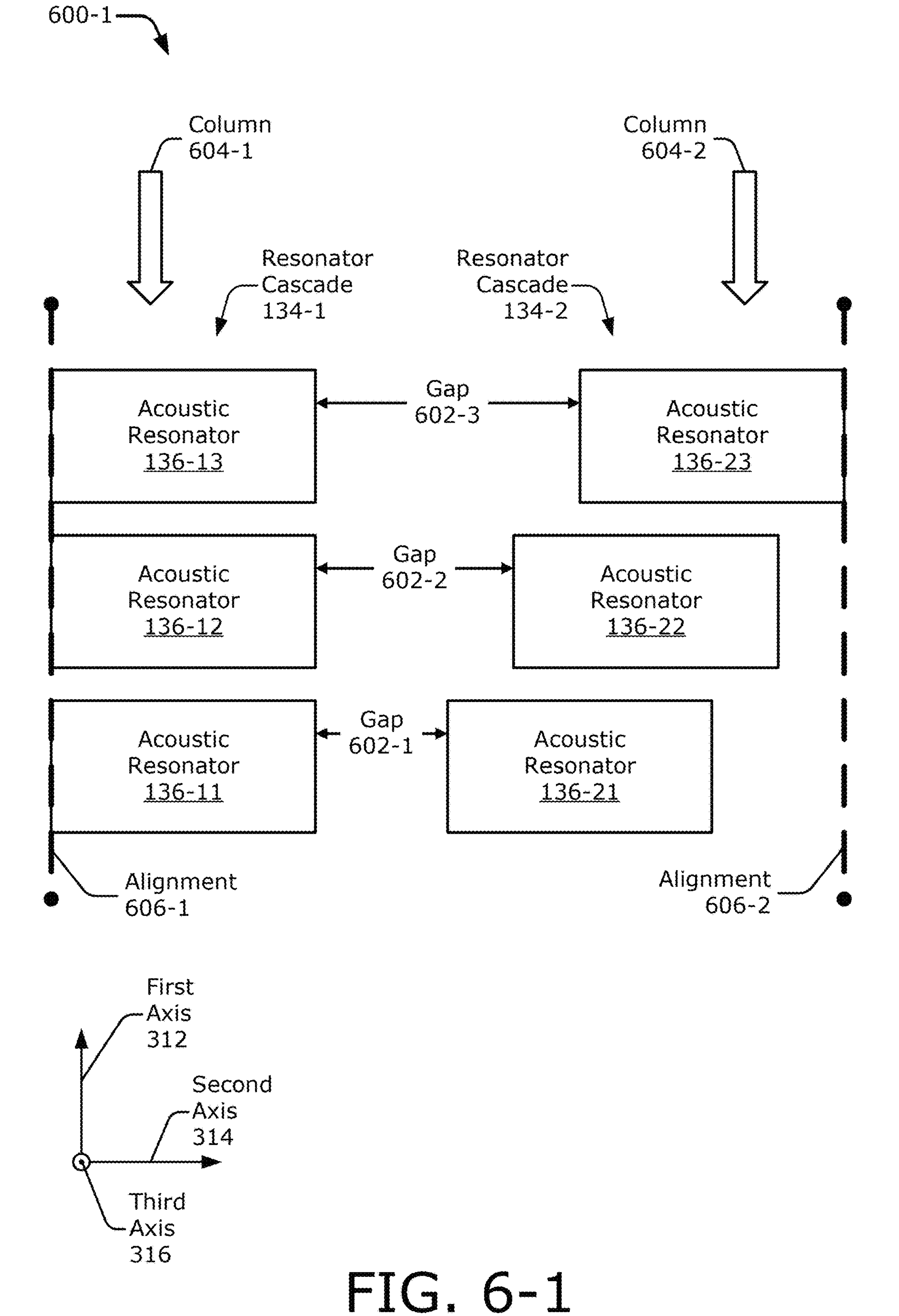
Figures 2, 6:
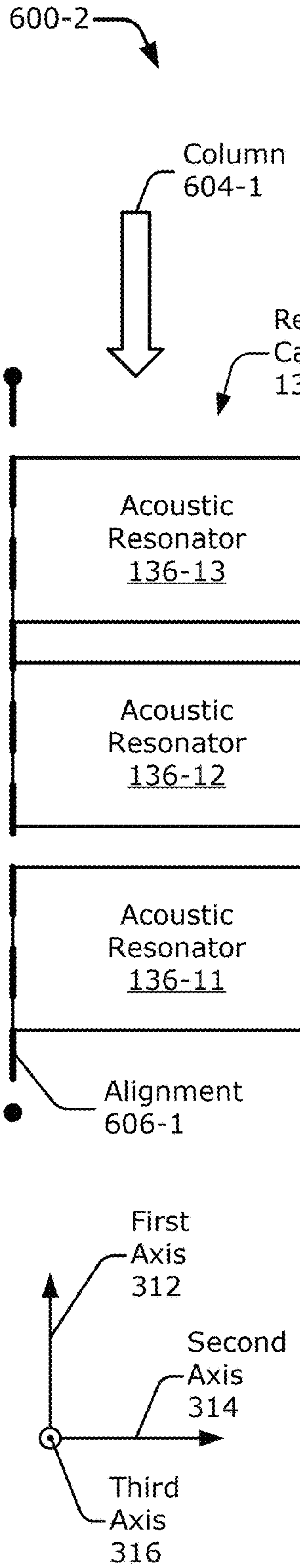
Figures 3, 6:
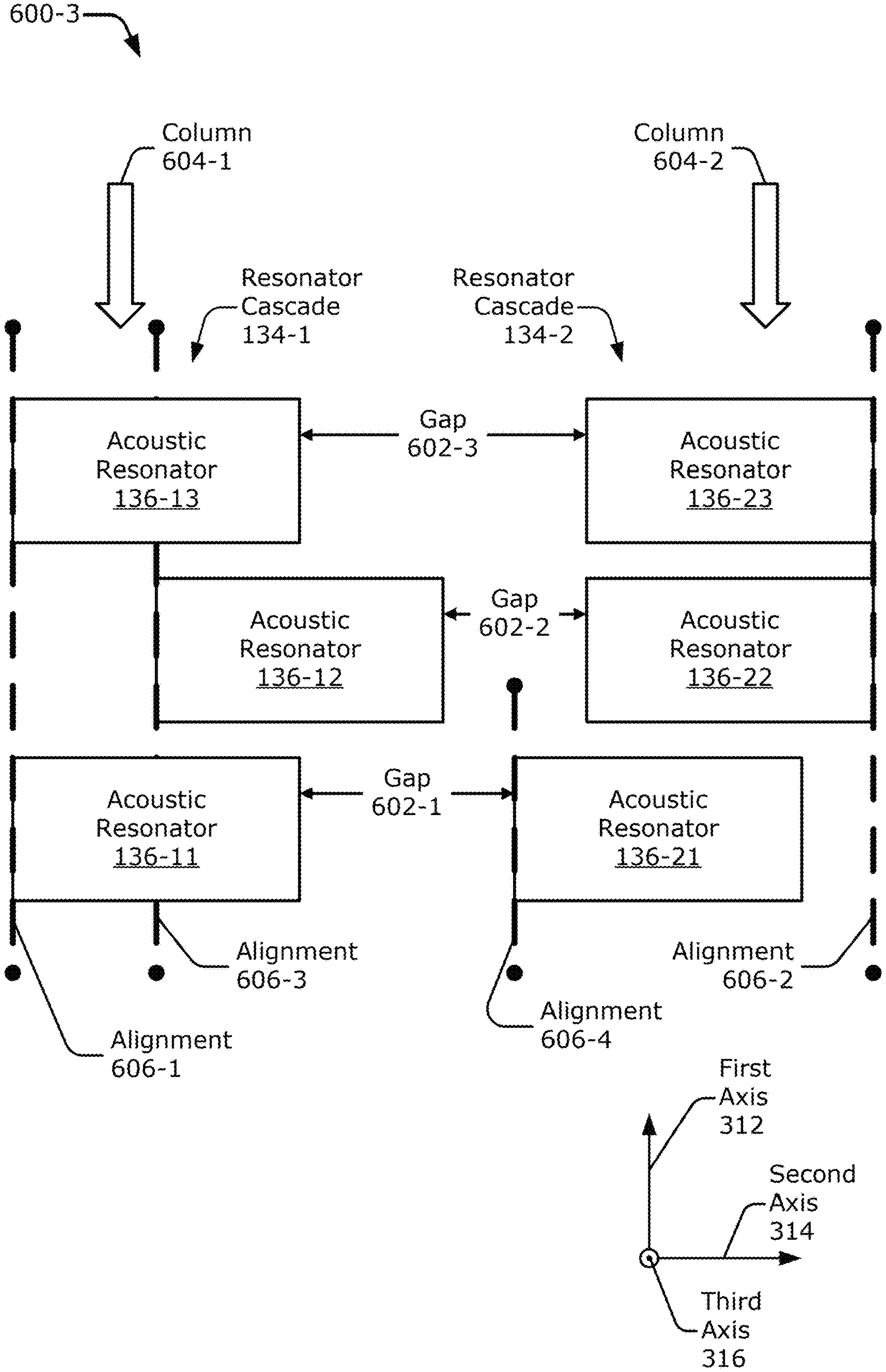
Figures 4, 6:
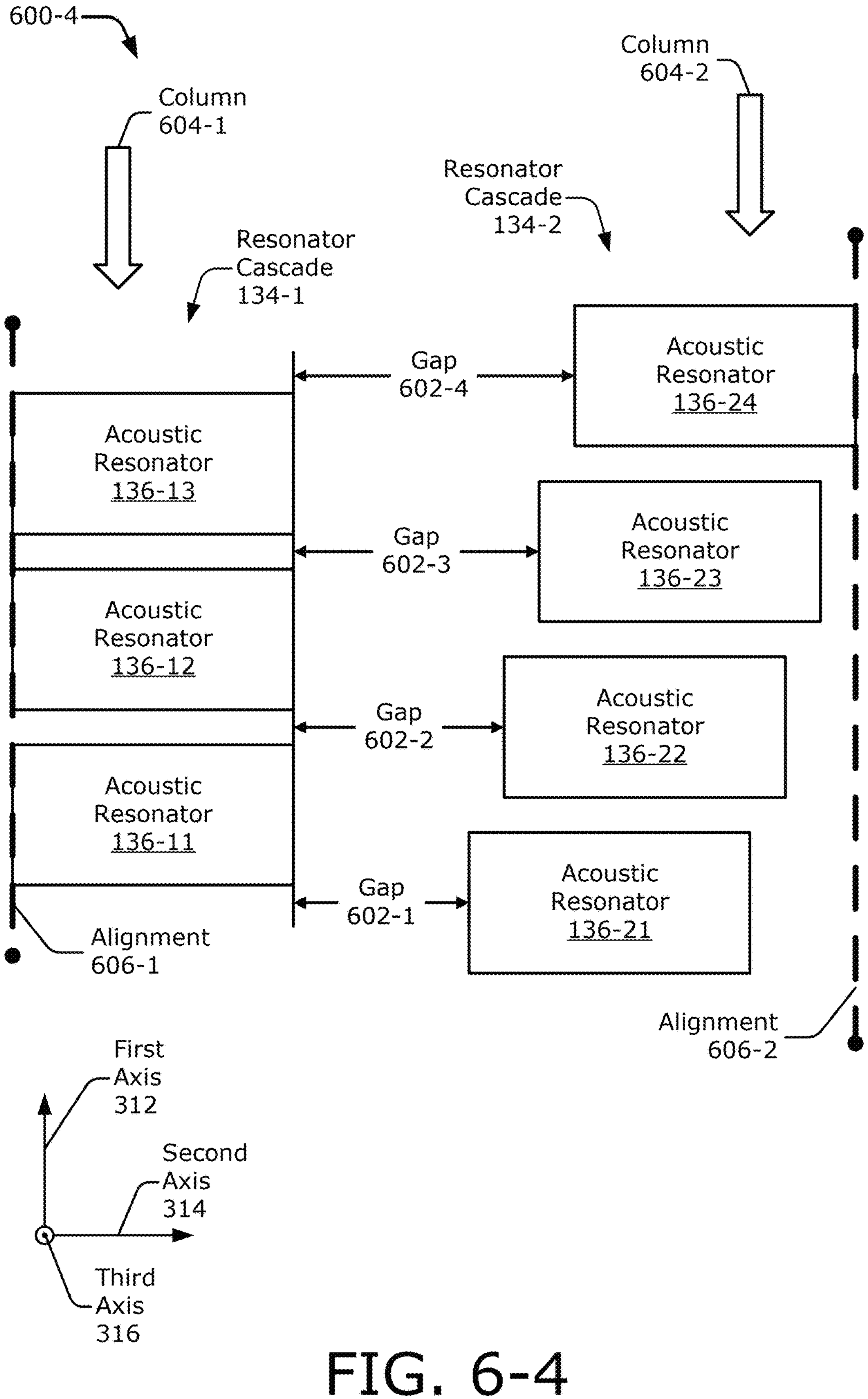
Figures 5, 6:
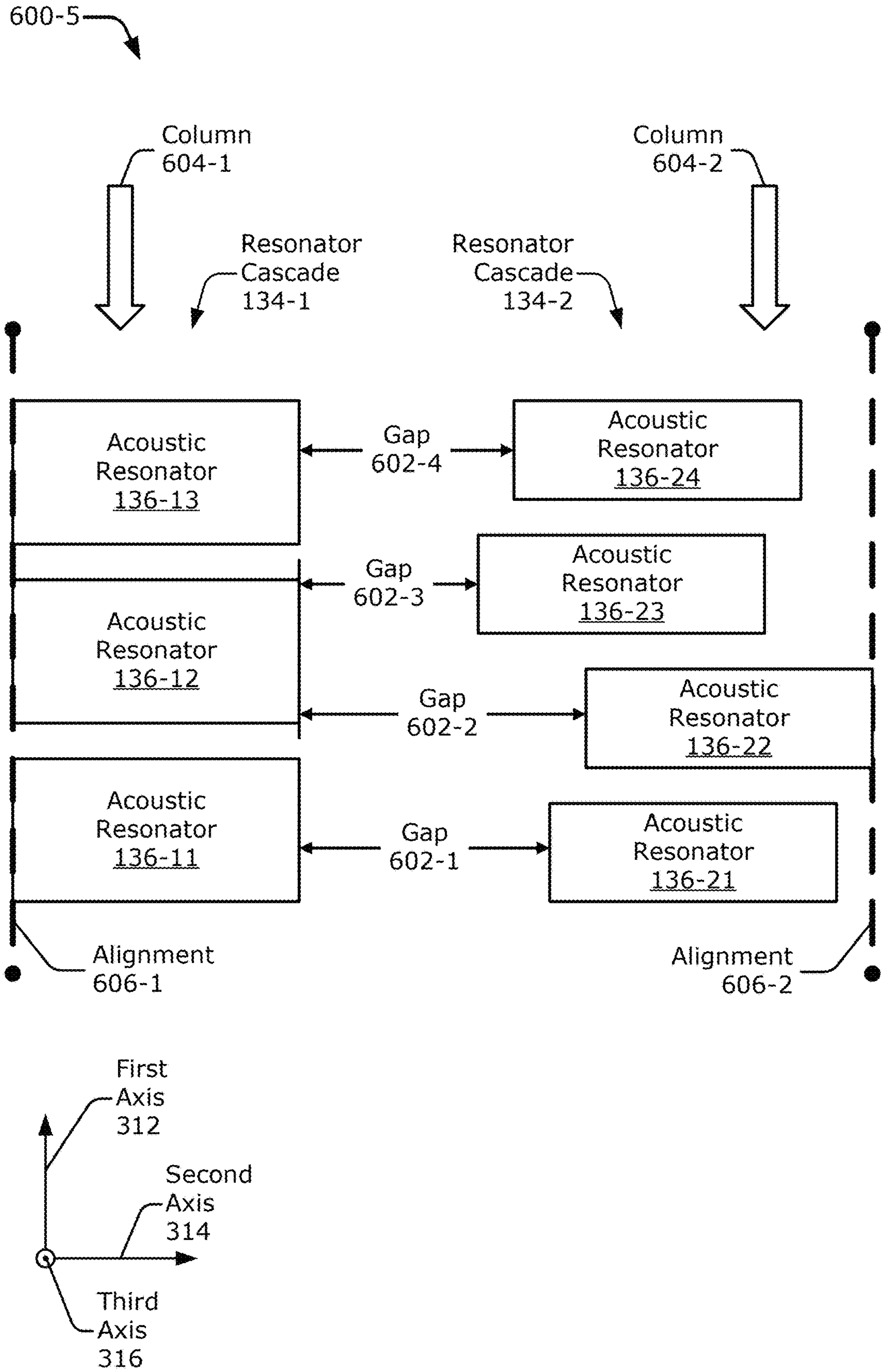

FIGS. 6-1 to 6-5 are schematic diagrams 600-1 to 600-5 illustrating example implementations of two resonator cascades 134-1 and 134-2 in which gaps between acoustic resonators of the two resonator cascades 134-1 and 134-2 have varying lengths. As illustrated, a first resonator cascade 134-1 of multiple acoustic resonators 136-11, 136-12, and 136-13 is disposed on a surface 502 of a piezoelectric layer 424 of a substrate 426 (each of FIG. 5) in a first column 604-1 along a first axis 312. A second resonator cascade 134-2 of multiple acoustic resonators 136-21, 136-22, and 136-23 is disposed on the surface 502 of the piezoelectric layer 424 of the substrate 426 in a second column 604-2 along the first axis 312. The multiple acoustic resonators may be disposed directly or indirectly on the piezoelectric layer 424. As described above, an acoustic resonator may be indirectly disposed on the piezoelectric layer 424 if an "intervening" layer is present between the electrode structure 422 of the acoustic resonator 136 and the piezoelectric layer 424 of the substrate 426.

Multiple gaps 602-1, 602-2, and 602-3 extend along the second axis 314 between the two resonator cascades. Each gap of the multiple gaps 602-1, 602-2, and 602-3 can have a different length relative to other gaps. In some cases, lengths of all gaps are different from each other. In other cases, fewer than all gaps—such as at least two gaps—have lengths that are different from each other, but two or more gaps may have a same length. A first gap 602-1 extends along the second axis 314 between the first resonator cascade 134-1 with multiple acoustic resonators and the second resonator cascade 134-2 with multiple other acoustic resonators. Similarly, a second gap 602-2 extends along the second axis 314 between the first resonator cascade 134-1 with its multiple acoustic resonators and the second resonator cascade 134-2 with its multiple acoustic resonators.

Further, a third gap 602-3 extends along the second axis 314 between the first resonator cascade 134-1 with its multiple acoustic resonators and the second resonator cascade 134-2 with its multiple acoustic resonators. As shown, the first gap 602-1 is different from the second gap 602-2, and the second gap 602-2 is different from the third gap 602-3. The first gap 602-1 is also different from the third gap 602-3. Although each gap 602 of the illustrated set of gaps has a different length than each other gap, two or more gaps may have an equal gap length even as other gap lengths are different from each other. Although three gaps are depicted in FIG. 6-1, two neighboring resonator cascades may have more or fewer gaps between them (e.g., two, five, or seven gaps).

Generally, spatially shifting one or more acoustic resonators 136 in at least one resonator cascade 134 to create multiple gaps 602 having multiple different lengths provides a mechanism for reducing at, e.g., the second resonator cascade 134-2 a "constructive" interference from bulk wave 506 signaling that emanates from the first resonator cascade 134-1 and reflects off the backside 504 of the substrate 426. Further, the signaling can be reciprocal or bidirectional between the two resonator cascades. Thus, the spatial shifting can also provide a mechanism for reducing at the first resonator cascade 134-1 interference from bulk wave 506 signaling that emanates from the second resonator cascade 134-2 and reflects off the backside 504 of the substrate 426.

Implementing variable gap lengths between two acoustic resonators can be realized in different manners. For example, one resonator cascade may have unaligned acoustic resonators while the other resonator cascade has aligned acoustic resonators. Alternatively, two resonator cascades may each have at least one unaligned acoustic resonator. Additionally or alternatively, the gap pattern may vary between implementations. Further, a quantity of acoustic resonators may differ between two resonator cascade. Also, sizes of acoustic resonators, in width and/or length, may differ at least between two resonator cascades. These various alternatives, as well as others, may be combined in different manners to realize resonator cascades with variable gap lengths. The acoustic resonator drawings in FIGS. 6-1 to 6-5 are not necessarily drawn to scale.

In the example schematic diagram 600-1 of FIG. 6-1, each of three gaps 602-1, 602-2, and 602-3 is different from the other. In this example implementation, the first gap 602-1 extends between a first acoustic resonator 136-11 of the first resonator cascade 134-1 and a first acoustic resonator 136-21 of the second resonator cascade 134-2. Similarly, the second gap 602-2 extends between a second acoustic resonator 136-12 of the first resonator cascade 134-1 and a second acoustic resonator 136-22 of the second resonator cascade 134-2. Further, a third gap 602-3 extends between a third acoustic resonator 136-13 of the first resonator cascade 134-1 and a third acoustic resonator 136-23 of the second resonator cascade 134-2.

The schematic diagram 600-1 to 600-5 are not necessarily depicted to scale. Consider, for example, the schematic diagram 600-1. The differences between gap lengths are exaggerated relative to the likely total lengths of the acoustic resonators for clarity. For example, a difference in a length of the third gap 602-3 relative to other gap lengths can be less than twice a pitch 414 of an interdigital transducer 302 (both of FIG. 4) of one or more acoustic resonators, such as the third acoustic resonator 136-23.

As shown in FIG. 6-1, creating gaps having different lengths results in the multiple acoustic resonators of at least one resonator cascade 134 having varying alignments relative to the second axis 314. The first resonator cascade 134-1 has a common alignment across the multiple acoustic resonators 136-11, 136-12, and 136-13, as is indicated by an alignment 606-1 that matches the placements of the three acoustic resonators. The second resonator cascade 134-2, on the other hand, has varied alignments across the multiple acoustic resonators 136-21, 136-22, and 136-23. This is indicated by an alignment 606-2 that matches the placement of the third acoustic resonator 136-23 but does not match the placements of the other two acoustic resonators.

In FIG. 6-1, the multiple acoustic resonators 136-21, 136-22, 136-23 of the second resonator cascade 134-2 form a "stair-stepped" appearance as the lengths of the gaps 602-1 to 602-3 increase monotonically along the first axis 312. The gaps 602-1 to 602-3 can, however, be formed differently.

In FIG. 6-2, the multiple acoustic resonators 136-21, 136-22, and 136-23 of the second resonator cascade 134-2 do not form a "stair-stepped" appearance. As shown, a length of the second gap 602-2, or the "middle" gap relative to the first axis 312, is shorter than a length of the third gap 602-3 but longer than a length of the first gap 602-1. Generally, the gaps can be created in any order or pattern.

In FIGS. 6-1 and 6-2, the multiple acoustic resonators 136-11, 136-12, and 136-13 of the first resonator cascade 134-1 have a common alignment along the alignment 606-1. The alignments of the second resonator cascade 134-2, on the other hand, along the second axis 314 vary. The alignments of two neighboring resonator cascades, however, can vary.

In FIG. 6-3, the multiple acoustic resonators 136-21, 136-22, 136-23 of the second resonator cascade 134-2 do not have a common alignment. The acoustic resonators 136-22 and 136-23 have a common alignment 606-2, but the acoustic resonator 136-21 varies from this as indicated by the placement of the acoustic resonator 136-21 matching an alignment 606-4. Accordingly, to form three gaps having three different lengths, the multiple acoustic resonators 136-11, 136-12, and 136-13 of the first resonator cascade 134-1 do not have a common alignment. The acoustic resonators 136-11 and 136-13 have a common alignment 606-1, but the acoustic resonator 136-12 varies from this as indicated by an alignment 606-3. Specifically, the acoustic resonator 136-12 is spatially shifted toward the second resonator cascade 134-2 relative to the acoustic resonators 136-11 and 136-13 to form the second gap 602-2 having another different length.

The principles and techniques described herein can involve various other implementations. For example, a quantity of acoustic resonators included in one resonator cascade can vary from another quantity of acoustic resonators included in another resonator cascade. In FIG. 6-4, the first resonator cascade 134-1 includes three acoustic resonators: a first acoustic resonator 136-11, a second acoustic resonator 136-12, and a third acoustic resonator 136-13. The second resonator cascade 134-2, on the other hand, includes four acoustic resonators: a first acoustic resonator 136-21, a second acoustic resonator 136-22, a third acoustic resonator 136-23, and a fourth acoustic resonator 136-24.

In the example of FIG. 6-4, the acoustic resonators of the first resonator cascade 134-1 have a substantially similar size to the acoustic resonators of the second resonator cascade 134-2. Here, a "substantially similar size" may correspond to two items that are architected to be equal sizes and fabricated as such within acceptable manufacturing tolerances. In other cases, however, the acoustic resonators of the first resonator cascade 134-1 may have a different size relative to the acoustic resonators of the second resonator cascade 134-2. In FIG. 6-5, for example, the three acoustic resonators of the first resonator cascade 134-1 jointly occupy a distance along the first axis 312 that is similar to a distance jointly occupied by the four acoustic resonators of the second resonator cascade 134-2. Two acoustic resonators with different sizes may have different widths and/or different lengths relative to each other.

FIGS. 6-1 to 6-5 illustrate multiple example implementations. Although each example implementation is depicted separately, the various implementations may also be combined in different manners. For example, with respect to FIG. 6-4, at least one acoustic resonator 136 of the first resonator cascade 134-1 may be spatially shifted to be unaligned with the other acoustic resonators. Further, with respect to FIG. 6-5, the multiple acoustic resonators 136-21 to 136-24 of the second resonator cascade 134-2 can be disposed on the substrate to form a "stair-stepped" structure like in FIG. 6-1.

Other implementations are also possible. Generally, multiple acoustic resonators 136 of a first resonator cascade 134-1 can have a quantity of "A" acoustic resonators, with "A" representing an integer greater than one. In other words, the quantity of acoustic resonators in the first resonator cascade 134-1 is "A." Also, multiple acoustic resonators 136 of a second resonator cascade 134-2 can have a quantity of "B" acoustic resonators, with "B" representing an integer greater than one (e.g., or greater than two). In other words, the quantity of acoustic resonators in the second resonator cascade 134-2 is "B." Multiple gaps 602 extend along the second axis 314 between the first resonator cascade 134-1 of multiple acoustic resonators and the second resonator cascade 134-2 of multiple acoustic resonators. The multiple gaps can include a first gap 602-1, a second gap 602-2, and a third gap 602-3.

With regard to the quantity of acoustic resonators, in some cases, the quantity "A" can be different from the quantity "B." In other case, the quantity "A" can be equal to the quantity "B." With regard to sizes of acoustic resonators, in some cases, a size of the multiple acoustic resonators of the first resonator cascade 134-1 can be different from a size of the multiple acoustic resonators of the second resonator cascade 134-2. In other cases, a size of the multiple acoustic resonators of the first resonator cascade 134-1 can be substantially the same as a size of the multiple acoustic resonators of the second resonator cascade. Here, a "substantially same size" can correspond to being equal sized or to being within ten percent (10%), five percent (5%), three percent (3%), or even (1%) of each other. A size of an acoustic resonator 136 can relate to a length of the acoustic resonator 136, a width of the acoustic resonator 136, or both the length and the width (e.g., a size of a side or perimeter edge that is parallel to the first axis 312 and/or the second axis 314).

With multiple gaps having different lengths between the first and second resonator cascades 134-1 and 134-2, the multiple gaps can include a smallest gap (e.g., the first gap 602-1 in FIG. 6-1 and the second gap 602-2 in FIG. 6-2) and multiple other gaps. The multiple other gaps may be larger than the smallest gap by an amount that is less than twice a pitch of at least one interdigital transducer of the multiple acoustic resonators of the first resonator cascade 134-1 or the multiple acoustic resonators of the second resonator cascade 134-2.

The variances of the multiple gaps may be implemented in different manners. For example, the multiple gaps can have a quantity of "N," with "N" representing an integer greater than one. Respective amounts by which respective gaps of the multiple other gaps are larger than the smallest gap can be based on the following equation (1):

$$(M \times 2 \times \text{Pitch})/N, \tag{1}$$

where: "Pitch" corresponds to the pitch of the at least one interdigital transducer of the multiple acoustic resonators of the first resonator cascade 134-1 or the multiple acoustic resonators of the second resonator cascade 134-2, and the variable "M" corresponds to [0, 1, 2, . . . (N−1)]. The computational results of equation (1) are periodic with "2×Pitch." Thus, the gap variance values based on (e.g., obtained using) equation (1) may also be increased by multiples of "2×Pitch." A gap variance of "2×Pitch," however, provides a neutral result. By using such an approach, the gap length differences can be evenly distributed across twice the pitch to thereby evenly distribute the arrival of the peaks of the reflected bulk waves 506 (of FIG. 5) without the periodicity repeating.

Regarding alignments of the multiple acoustic resonators, one or two resonator cascades may have unaligned acoustic resonators. Thus, the multiple acoustic resonators of the first resonator cascade 134-1 can have a common alignment (e.g., the alignment 606-1 of FIG. 6-2) relative to the second axis 314. Further, the multiple acoustic resonators of the second resonator cascade 134-2 can have multiple alignments (e.g., the different alignments compared to the alignment 606-2 in FIG. 6-2) relative to the second axis 314 that differ from each other to create the multiple gaps. Alternatively, the multiple acoustic resonators of the first resonator cascade 134-1 can have at least one alignment (e.g., the alignment 606-3 of FIG. 6-3) relative to the second axis 314 that differs from at least one other alignment (e.g., the alignment 606-1 of FIG. 6-3) thereof to create at least one gap 602-2 of the multiple gaps. Further, the multiple acoustic resonators of the second resonator cascade 134-2 can have at least one alignment (e.g., the alignment 606-4 of FIG. 6-3) relative to the second axis 314 that differs from at least one other alignment (e.g., the alignment 606-2 of FIG. 6-3) thereof to create at least one other gap 602-1 of the multiple gaps.

Figures 1, 7:
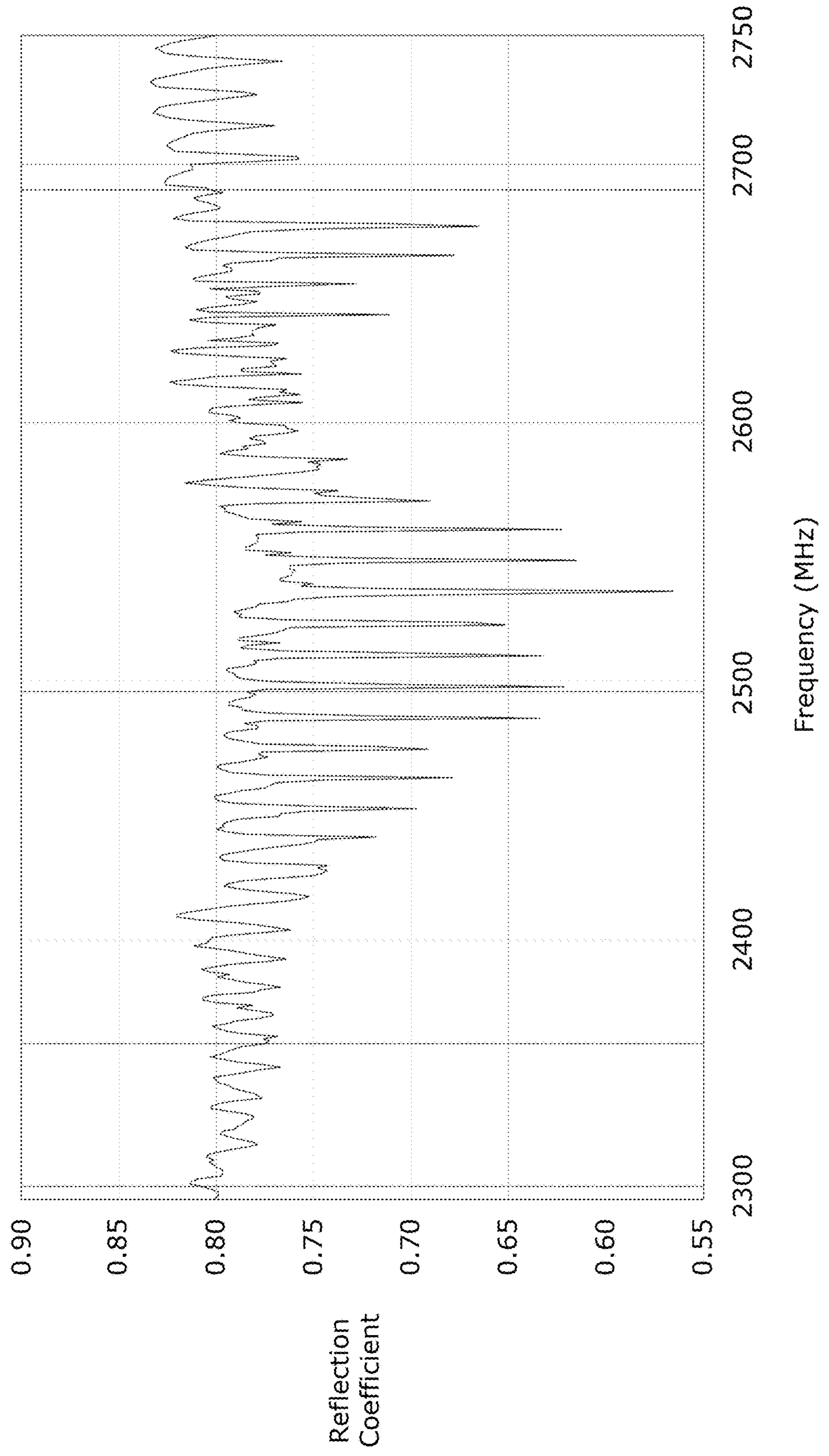
Figures 2, 7:
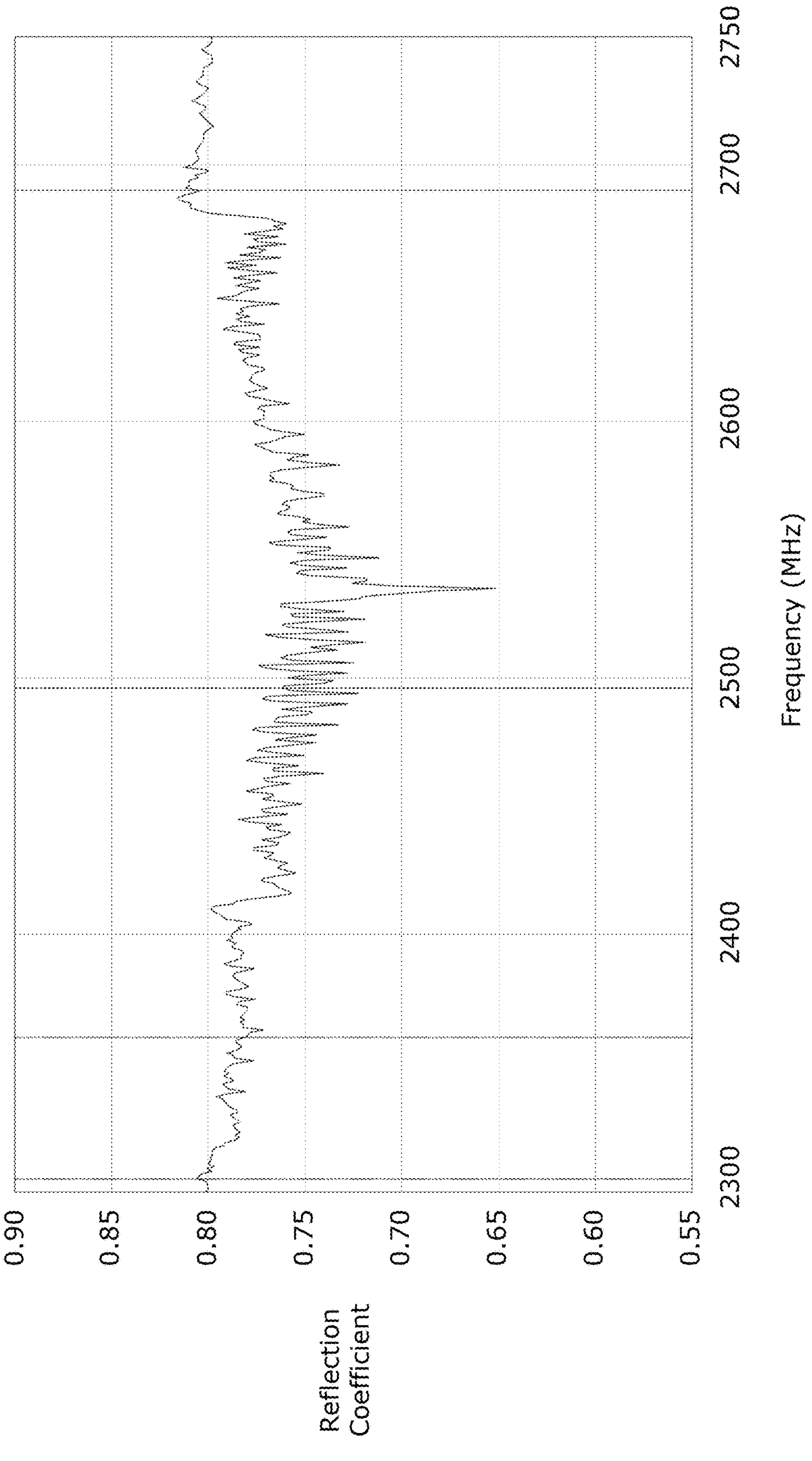

FIG. 7-1 is a graph 700-1 illustrating an example reflection coefficient corresponding to at least one filter circuit that has resonator cascade gaps of a constant length. FIG. 7-2 is a graph 700-2 illustrating an example reflection coefficient corresponding to at least one filter circuit that has resonator cascade gaps of different lengths in accordance with example described implementations. These two graphs 700-1 and 700-2 depict a reflection coefficient at the antenna port versus frequency (in MHz). The illustrated values for reflection coefficient and a selected frequency range are provided by way of example only to show an instance of relative performance.

For the graph 700-1, the reflection coefficient ranges between approximately 0.57 and 0.82. In contrast, for the graph 700-2, the reflection coefficient ranges between approximately 0.65 and 0.82. The range for the graph 700-2 is therefore lower. Further, by reviewing the two graphs visually, it is apparent that individual dips in the reflection coefficient are appreciably greater in the graph 700-1 than in the graph 700-2. For instance, in the graph 700-1, multiple individual dips span 0.10 to 0.15. In the graph 700-2, on the other hand, most individual dips span less than 0.05. The graph 700-2 of FIG. 7-2 corresponds to application of the described principles to spatially shift multiple acoustic resonators of at least one resonator cascade to provide neighboring resonator cascades with variable gaps. Accordingly, application of such principles can provide a higher quality reflection coefficient.

Figure 8:
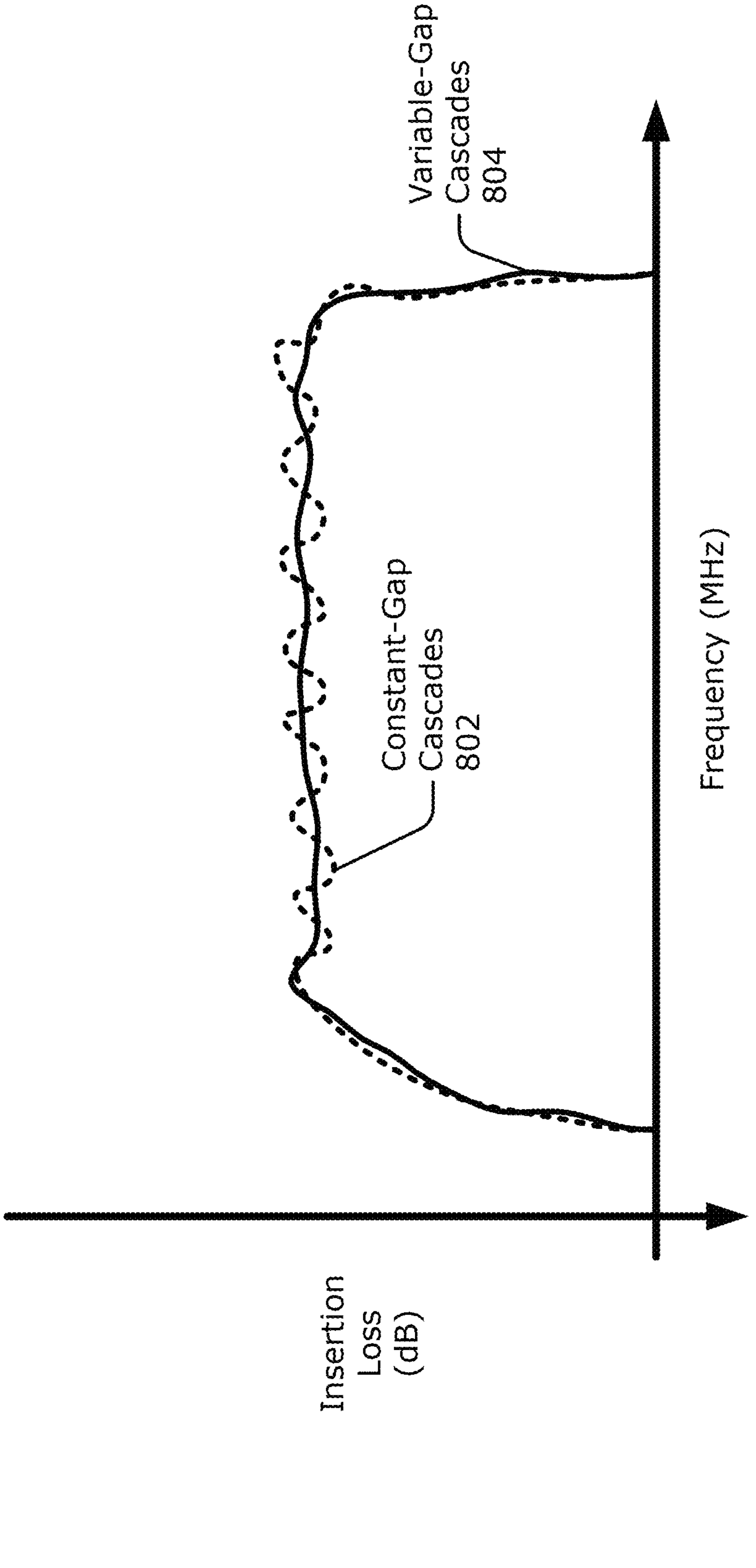
FIG. 8 is a graph illustrating insertion loss examples corresponding to at least one filter circuit that has constant-gap resonator cascades and at least one filter circuit that has variable-gap resonator cascades.

FIG. 8 is a graph 800 illustrating insertion loss examples corresponding to at least one filter circuit that has constant-gap resonator cascades and at least one filter circuit that has variable-gap resonator cascades. The graph 800 illustrates insertion loss (in dB) that increases in a downward direction (as depicted) versus frequency (in MHz) that increases in a rightward direction (as depicted). The dashed line 802 is produced using at least one filter circuit with constant-gap resonator cascades. The solid line 804, on the other hand, is produced using at least one filter circuit with variable-gap resonator cascades to space out arrival of the peaks of a reflected bulk wave. By reviewing the graph 800 visually, it is apparent that the dashed line 802 has noticeable ripples, which are undesirable, compared to the solid line 804.

Accordingly, implementing techniques as described herein can improve performance of carrier aggregation (CA) combinations that would otherwise be affected by out-of-band gamma ripples. This is illustrated in FIG. 8. The graph 800 shows an effect of out-of-band gamma ripples created by one filter in the passband frequency range of a second filter, which second filter is multiplexed with the first filter (e.g., the two filters are connected to the same antenna). In some of such cases, the ripples in the reflection coefficient of the first filter can translate into ripples in the passband of the second filter.

Figure 9:
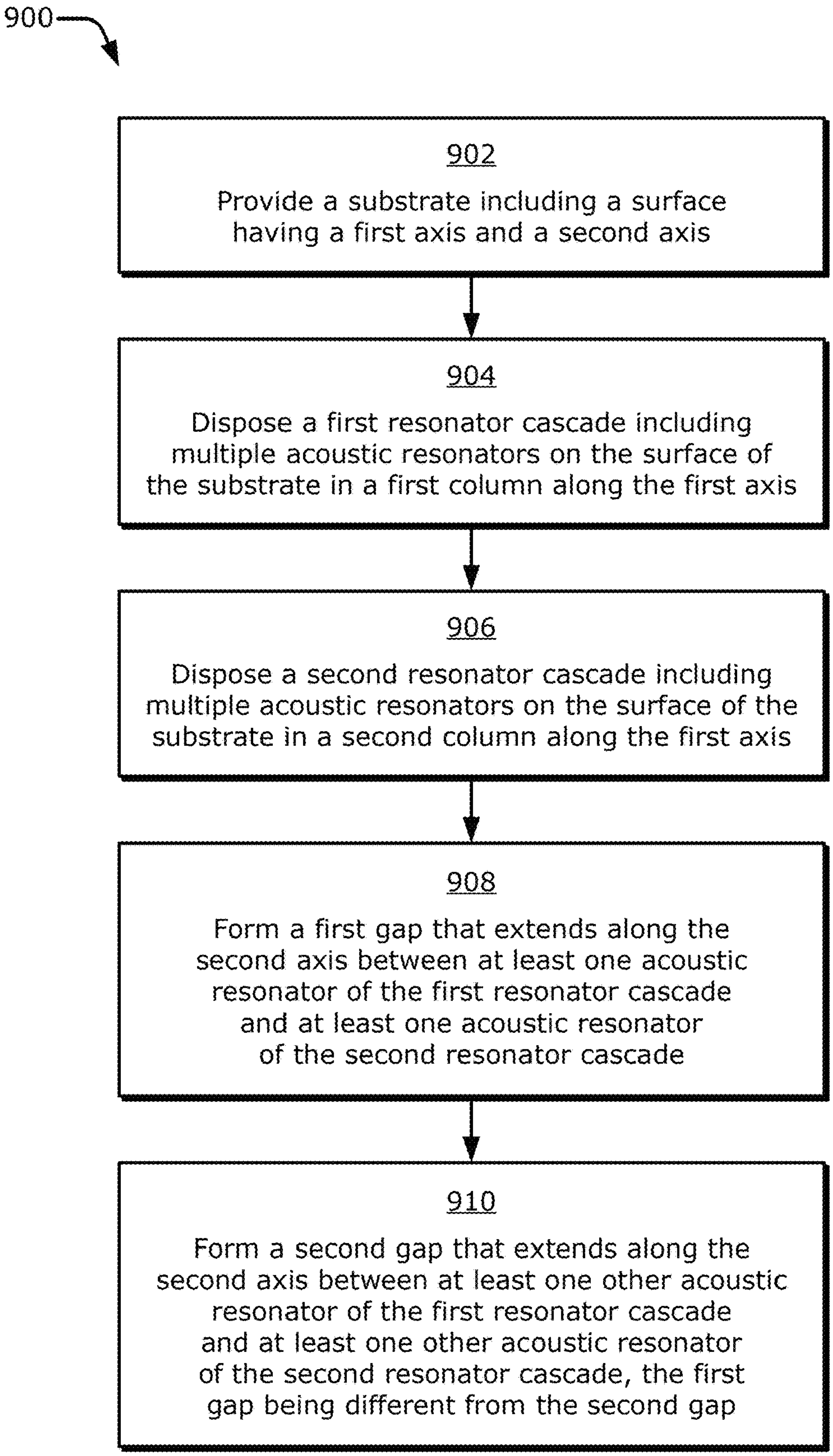
FIG. 9 is a flow diagram illustrating an example process for manufacturing at least one filter circuit including two resonator cascades.

FIG. 9 is a flow diagram illustrating an example process 900 for manufacturing at least one filter circuit including two resonator cascades. The process 900 includes five blocks 902-910 that specify operations that can be performed for a method. However, operations are not necessarily limited to the order shown in the figures or described herein, for the operations may be implemented in alternative orders or in fully or partially overlapping manners. Also, more, fewer, and/or different operations may be implemented to perform a respective process or an alternative process.

At block 902, a substrate including a surface having a first axis and a second axis is provided. For example, fabrication equipment can provide a substrate 426 that includes a surface 502 having a first axis 312 and a second axis 314. The surface 502 may be realized using piezoelectric material of a piezoelectric layer 424 of the substrate 426 as part of one or more acoustic resonators. In some cases, the surface 502 may be substantially planar, and the first axis 312 may be substantially orthogonal to the second axis 314.

At block 904, a first resonator cascade including multiple acoustic resonators is disposed on the surface of the substrate in a first column along the first axis. For example, the fabrication equipment can dispose a first resonator cascade 134-1 including multiple acoustic resonators 136-1 . . . 136-A on the surface 502 of the substrate 426 in a first column 604-1 along the first axis 312. To do so, the multiple acoustic resonators 136-1 . . . 136-A, each of which may include at least one interdigital transducer 302, may be placed on a common alignment (e.g., the alignment 606-1 of FIG. 6-1) with respect to the second axis 314.

At block 906, a second resonator cascade including multiple acoustic resonators is disposed on the surface of the substrate in a second column along the first axis. For example, the fabrication equipment can dispose a second resonator cascade 134-2 including multiple acoustic resonators 136-1 . . . 136-B on the surface 502 of the substrate 426 in a second column 604-2 along the first axis 312. To do so, the multiple acoustic resonators 136-1 . . . 136-B, each of which may include at least one interdigital transducer 302, may be placed on different alignments (e.g., one on the alignment 606-2 of FIG. 6-1 and the others on a position that is separated from the alignment 606-2) with respect to the second axis 314.

At block 908, a first gap that extends along the second axis between at least one acoustic resonator of the first resonator cascade and at least one acoustic resonator of the second resonator cascade is formed. For example, the fabrication equipment can form a first gap 602-1 that extends along the second axis 314 between at least one acoustic resonator (e.g., the acoustic resonator 136-11) of the first resonator cascade 134-1 and at least one acoustic resonator (e.g., the acoustic resonator 136-21) of the second resonator cascade 134-2 (e.g., as shown in FIG. 6-1). Here, the first gap 602-1 may be a smallest gap of multiple different gaps between the first and second resonator cascade 134-1 and 134-2.

At block 910, a second gap that extends along the second axis between at least one other acoustic resonator of the first resonator cascade and at least one other acoustic resonator of the second resonator cascade is formed, with the first gap being different from the second gap. For example, the fabrication equipment can form a second gap 602-2 that extends along the second axis 314 between at least one other acoustic resonator (e.g., the acoustic resonator 136-12) of the first resonator cascade 134-1 and at least one other acoustic resonator (e.g., the acoustic resonator 136-22) of the second resonator cascade 134-2 (e.g., as shown in FIG. 6-1). Here, the first gap 602-1 is different from the second gap 602-2. For instance, a length of the first gap 602-1 may be shorter than a length of the second gap 602-2. This may be performed by increasing the length of the second gap 602-2 relative to the length of the first gap 602-1 by less than double a pitch 414 of an acoustic resonator 136 of one of the two resonator cascades or by more than double the pitch 414.

Implementation Examples

This section describes some aspects of example implementations and/or example configurations related to the apparatuses and/or processes presented above.

Example aspect 1: An apparatus comprising:
at least one filter circuit comprising:
- a substrate comprising a surface having a first axis and a second axis;
- a first resonator cascade of multiple acoustic resonators disposed on the surface of the substrate in a first column along the first axis; and
- a second resonator cascade of multiple acoustic resonators disposed on the surface of the substrate in a second column along the first axis,
- a first gap extending along the second axis between the first resonator cascade of multiple acoustic resonators and the second resonator cascade of multiple acoustic resonators, and
- a second gap extending along the second axis between the first resonator cascade of multiple acoustic resonators and the second resonator cascade of multiple acoustic resonators, the first gap different from the second gap.

Example aspect 2: The apparatus of example aspect 1, wherein:
the first resonator cascade of multiple acoustic resonators comprises a first acoustic resonator and a second acoustic resonator;
the second resonator cascade of multiple acoustic resonators comprises a third acoustic resonator and a fourth acoustic resonator;
the first gap extends between the first acoustic resonator and the third acoustic resonator; and
the second gap extends between the second acoustic resonator and the fourth acoustic resonator.

Example aspect 3: The apparatus of example aspect 2, wherein:
the first acoustic resonator comprises at least one interdigital transducer (IDT) and at least one reflector; and
the third acoustic resonator comprises at least one interdigital transducer (IDT) and at least one reflector.

Example aspect 4: The apparatus of any one of the preceding example aspects, wherein:
the multiple acoustic resonators of the first resonator cascade comprise piezoelectric material that forms at least part of a piezoelectric layer of the substrate and that provides the surface of the substrate; and
the multiple acoustic resonators of the second resonator cascade comprise the piezoelectric material that forms at least part of the piezoelectric layer of the substrate.

Example aspect 5: The apparatus of any one of the preceding example aspects, wherein:
at least one acoustic resonator of the multiple acoustic resonators of the first resonator cascade comprises at least part of a double-mode surface acoustic wave (SAW) (DMS) filter; and at least one acoustic resonator of the multiple acoustic resonators of the second resonator cascade comprises at least part of another DMS filter.

Example aspect 6: The apparatus of any one of the preceding example aspects, wherein:

the multiple acoustic resonators of the first resonator cascade are coupled together in series; and the multiple acoustic resonators of the second resonator cascade are coupled together in series.

Example aspect 7: The apparatus of any one of the preceding example aspects, wherein:

the at least one filter circuit comprise a first filter circuit and a second filter circuit;

the first filter circuit comprises the first resonator cascade;

the second filter circuit comprises the second resonator cascade; and the first axis is substantially orthogonal to the second axis.

Example aspect 8: The apparatus of any one of the preceding example aspects, wherein:

the multiple acoustic resonators of the first resonator cascade have a quantity of "A" acoustic resonators, with "A" representing an integer greater than one;

the multiple acoustic resonators of the second resonator cascade have a quantity of "B" acoustic resonators, with "B" representing an integer greater than one; and multiple gaps extend along the second axis between the first resonator cascade of multiple acoustic resonators and the second resonator cascade of multiple acoustic resonators, the multiple gaps including the first gap and the second gap.

Example aspect 9: The apparatus of example aspect 8, wherein the quantity "A" is different from the quantity "B."

Example aspect 10: The apparatus of example aspect 8, wherein the quantity "A" is equal to the quantity "B."

Example aspect 11: The apparatus of example aspect 8 or any one of the other preceding example aspects, wherein a size of the multiple acoustic resonators of the first resonator cascade is different from a size of the multiple acoustic resonators of the second resonator cascade.

Example aspect 12: The apparatus of example aspect 8 or any one of the other preceding example aspects, wherein a size of the multiple acoustic resonators of the first resonator cascade is substantially the same as a size of the multiple acoustic resonators of the second resonator cascade.

Example aspect 13: The apparatus of example aspect 8 or any one of the other preceding example aspects, wherein:

the multiple gaps comprise a smallest gap and multiple other gaps;

the multiple gaps have a quantity of "N," with "N" representing an integer greater than one; and respective amounts by which respective gaps of the multiple other gaps are larger than the smallest gap are based on:

$$(M \times 2 \times \text{Pitch})/N,$$

where:

"Pitch" corresponds to a pitch of at least one interdigital transducer of the multiple acoustic resonators of the first resonator cascade or of the multiple acoustic resonators of the second resonator cascade; and "M" corresponds to [0, 1, 2, . . . , (N−1)].

Example aspect 14: The apparatus of example aspect 8 or any one of the other preceding example aspects, wherein:

the multiple acoustic resonators of the first resonator cascade have a common alignment relative to the second axis; and the multiple acoustic resonators of the second resonator cascade have multiple alignments relative to the second axis that differ from each other to create the multiple gaps.

Example aspect 15: The apparatus of example aspect 8 or any one of the other preceding example aspects, wherein:

the multiple acoustic resonators of the first resonator cascade have at least one alignment relative to the second axis that differs from at least one other alignment thereof to create at least one gap of the multiple gaps; and the multiple acoustic resonators of the second resonator cascade have at least one alignment relative to the second axis that differs from at least one other alignment thereof to create at least one other gap of the multiple gaps.

Example aspect 16: The apparatus of any one of the preceding example aspects, further comprising:

a radio-frequency front-end comprising the at least one filter circuit.

Example aspect 17: The apparatus of example aspect 16, further comprising:

a wireless interface device comprising the radio-frequency front-end;

a display screen; and at least one processor operatively coupled to the display screen and at least a portion of the wireless interface device, the at least one processor configured to present one or more graphical images on the display screen based on one or more wireless signals communicated using the at least one filter circuit of the wireless interface device.

Example aspect 18: An apparatus comprising:

at least one filter circuit comprising:

- a substrate comprising:
  - a surface having a first axis and a second axis; and
  - a backside that is opposite the surface;
- a first resonator cascade of multiple acoustic resonators disposed on the surface of the substrate in a first column along the first axis;
- a second resonator cascade of multiple acoustic resonators disposed on the surface of the substrate in a second column along the first axis, the second column spaced apart from the first column along the second axis; and
- means for reducing at the second resonator cascade interference from bulk wave signaling that emanates from the first resonator cascade and reflects off the backside of the substrate.

Example aspect 19: The apparatus of example aspect 18, wherein the means for reducing comprises:

means for reducing at the first resonator cascade interference from bulk wave signaling that emanates from the second resonator cascade and reflects off the backside of the substrate.

Example aspect 20: A method of manufacturing at least one filter circuit, the method comprising:

providing a substrate comprising a surface having a first axis and a second axis;

disposing a first resonator cascade comprising multiple acoustic resonators on the surface of the substrate in a first column along the first axis;

disposing a second resonator cascade comprising multiple acoustic resonators on the surface of the substrate in a second column along the first axis;

forming a first gap that extends along the second axis between at least one acoustic resonator of the first resonator cascade and at least one acoustic resonator of the second resonator cascade; and forming a second gap that extends along the second axis between at least one other acoustic resonator of the first resonator cascade and at least one other acoustic resonator of the second resonator cascade, the first gap different from the second gap.

CONCLUSION

As used herein, the terms "couple," "coupled," or "coupling" refer to a relationship between two or more components that are in operative communication with each other to implement some feature or realize some capability that is described herein. The coupling can be realized using, for instance, a physical line, such as a metal trace or wire, or an electromagnetic coupling, such as with a transformer. A coupling can include a direct coupling or an indirect coupling. A direct coupling refers to connecting discrete circuit elements via a same node without an intervening element. An indirect coupling refers to connecting discrete circuit elements via one or more other devices or other discrete circuit elements, including two or more different nodes.

The term "port" (e.g., including a "first port" or a "filter port") represents at least a point of electrical connection at or proximate to the input or output of a component or between two or more components (e.g., active or passive circuit elements or parts). Although at times a port may be visually depicted in a drawing as a single point (or a circle), the port can represent an inter-connected portion of a physical circuit or network that has at least approximately a same voltage potential at or along the portion. In other words, a single-ended port can represent at least one point (e.g., a node) of multiple points along a conducting medium (e.g., a wire or trace) that exists between electrically connected components. In some cases, a "port" can represent at least one node that represents or corresponds to an input or an output of a component, such as a filter or part thereof. Similarly, a "terminal" or a "node" may represent one or more points with at least approximately a same voltage potential relative to an input or output of a component.

The terms "first," "second," "third," and other numeric-related indicators are used herein to identify or distinguish similar or analogous items from one another within a given context—such as a particular implementation, a single drawing figure, a given component, or a claim. Thus, a first item in one context may differ from a first item in another context. For example, an item identified as a "first acoustic resonator" in one context may be identified as a "second acoustic resonator" in another context. Similarly, a "first resonator cascade" or a "first acoustic resonator" in one claim may be recited as a "second resonator cascade" or a "third acoustic resonator," respectively, in a different claim.

Unless context dictates otherwise, use herein of the word "or" may be considered use of an "inclusive or," or a term that permits inclusion or application of one or more items that are linked by the word "or" (e.g., a phrase "A or B" may be interpreted as permitting just "A," as permitting just "B," or as permitting both "A" and "B"). Also, as used herein, a phrase referring to "at least one of" a list of items refers to any combination of those items, including single members. For instance, "at least one of a, b, or c" can cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c, or any other ordering of a, b, and c). Further, items represented in the accompanying figures and terms discussed herein may be indicative of one or more items or terms, and thus reference may be made interchangeably to single or plural forms of the items and terms in this written description.

Although implementations for realizing an acoustic resonator cascade have been described in language specific to certain features and/or methods, the subject of the appended claims is not necessarily limited to the specific features or methods described. Rather, the specific features and methods are disclosed as example implementations for realizing an acoustic resonator cascade.

What is claimed is:

1. An apparatus comprising:

at least one filter circuit comprising:

a substrate comprising a surface having a first axis and a second axis;

a first resonator cascade of multiple acoustic resonators disposed on the surface of the substrate in a first column along the first axis; and a second resonator cascade of multiple acoustic resonators disposed on the surface of the substrate in a second column along the first axis, a first gap extending along the second axis between the first resonator cascade of multiple acoustic resonators and the second resonator cascade of multiple acoustic resonators, and a second gap extending along the second axis between the first resonator cascade of multiple acoustic resonators and the second resonator cascade of multiple acoustic resonators, the first gap different from the second gap.

2. The apparatus of claim 1, wherein:

the first resonator cascade of multiple acoustic resonators comprises a first acoustic resonator and a second acoustic resonator;

the second resonator cascade of multiple acoustic resonators comprises a third acoustic resonator and a fourth acoustic resonator;

the first gap extends between the first acoustic resonator and the third acoustic resonator; and the second gap extends between the second acoustic resonator and the fourth acoustic resonator.

3. The apparatus of claim 2, wherein:

the first acoustic resonator comprises at least one interdigital transducer (IDT) and at least one reflector; and the third acoustic resonator comprises at least one interdigital transducer (IDT) and at least one reflector.

4. The apparatus of claim 1, wherein:

the multiple acoustic resonators of the first resonator cascade comprise piezoelectric material that forms at least part of a piezoelectric layer of the substrate and that provides the surface of the substrate; and the multiple acoustic resonators of the second resonator cascade comprise the piezoelectric material that forms at least part of the piezoelectric layer of the substrate.

5. The apparatus of claim 1, wherein:

at least one acoustic resonator of the multiple acoustic resonators of the first resonator cascade comprises at least part of a double-mode surface acoustic wave (SAW) (DMS) filter; and at least one acoustic resonator of the multiple acoustic resonators of the second resonator cascade comprises at least part of another DMS filter.

6. The apparatus of claim 1, wherein:
the multiple acoustic resonators of the first resonator cascade are coupled together in series; and
the multiple acoustic resonators of the second resonator cascade are coupled together in series.

7. The apparatus of claim 1, wherein:
the at least one filter circuit comprise a first filter circuit and a second filter circuit;
the first filter circuit comprises the first resonator cascade;
the second filter circuit comprises the second resonator cascade; and
the first axis is substantially orthogonal to the second axis.

8. The apparatus of claim 1, wherein:
the multiple acoustic resonators of the first resonator cascade have a quantity of "A" acoustic resonators, with "A" representing an integer greater than one;
the multiple acoustic resonators of the second resonator cascade have a quantity of "B" acoustic resonators, with "B" representing an integer greater than one; and
multiple gaps extend along the second axis between the first resonator cascade of multiple acoustic resonators and the second resonator cascade of multiple acoustic resonators, the multiple gaps including the first gap and the second gap.

9. The apparatus of claim 8, wherein the quantity "A" is different from the quantity "B".

10. The apparatus of claim 8, wherein the quantity "A" is equal to the quantity "B".

11. The apparatus of claim 8, wherein a size of the multiple acoustic resonators of the first resonator cascade is different from a size of the multiple acoustic resonators of the second resonator cascade.

12. The apparatus of claim 8, wherein a size of the multiple acoustic resonators of the first resonator cascade is substantially the same as a size of the multiple acoustic resonators of the second resonator cascade.

13. The apparatus of claim 8, wherein:
the multiple gaps comprise a smallest gap and multiple other gaps;
the multiple gaps have a quantity of "N," with "N" representing an integer greater than one; and
respective amounts by which respective gaps of the multiple other gaps are larger than the smallest gap are based on:

$$(M \times 2 \times \text{Pitch})/N,$$

where:
"Pitch" corresponds to a pitch of at least one interdigital transducer of the multiple acoustic resonators of the first resonator cascade or of the multiple acoustic resonators of the second resonator cascade; and
"M" corresponds to [0, 1, 2, . . . , (N−1)].

14. The apparatus of claim 8, wherein:
the multiple acoustic resonators of the first resonator cascade have a common alignment relative to the second axis; and
the multiple acoustic resonators of the second resonator cascade have multiple alignments relative to the second axis that differ from each other to create the multiple gaps.

15. The apparatus of claim 8, wherein:
the multiple acoustic resonators of the first resonator cascade have at least one alignment relative to the second axis that differs from at least one other alignment thereof to create at least one gap of the multiple gaps; and
the multiple acoustic resonators of the second resonator cascade have at least one alignment relative to the second axis that differs from at least one other alignment thereof to create at least one other gap of the multiple gaps.

16. The apparatus of claim 1, further comprising:
a radio-frequency front-end comprising the at least one filter circuit.

17. The apparatus of claim 16, further comprising:
a wireless interface device comprising the radio-frequency front-end;
a display screen; and
at least one processor operatively coupled to the display screen and at least a portion of the wireless interface device, the at least one processor configured to present one or more graphical images on the display screen based on one or more wireless signals communicated using the at least one filter circuit of the wireless interface device.

18. An apparatus comprising:
at least one filter circuit comprising:
a substrate comprising:
a surface having a first axis and a second axis; and
a backside that is opposite the surface;
a first resonator cascade of multiple acoustic resonators disposed on the surface of the substrate in a first column along the first axis;
a second resonator cascade of multiple acoustic resonators disposed on the surface of the substrate in a second column along the first axis, the second column spaced apart from the first column along the second axis; and
means for reducing at the second resonator cascade interference from bulk wave signaling that emanates from the first resonator cascade and reflects off the backside of the substrate.

19. The apparatus of claim 18, wherein the means for reducing comprises:
means for reducing at the first resonator cascade interference from bulk wave signaling that emanates from the second resonator cascade and reflects off the backside of the substrate.

20. A method of manufacturing at least one filter circuit, the method comprising:
providing a substrate comprising a surface having a first axis and a second axis;
disposing a first resonator cascade comprising multiple acoustic resonators on the surface of the substrate in a first column along the first axis;
disposing a second resonator cascade comprising multiple acoustic resonators on the surface of the substrate in a second column along the first axis;
forming a first gap that extends along the second axis between at least one acoustic resonator of the first resonator cascade and at least one acoustic resonator of the second resonator cascade; and
forming a second gap that extends along the second axis between at least one other acoustic resonator of the first resonator cascade and at least one other acoustic resonator of the second resonator cascade, the first gap different from the second gap.

* * * * *